United States Patent [19]

Olnowich et al.

[11] Patent Number: 5,444,705
[45] Date of Patent: Aug. 22, 1995

[54] DUAL PRIORITY SWITCHING APPARATUS FOR SIMPLEX NETWORKS

[75] Inventors: Howard T. Olnowich, Endwell; Thomas N. Barker, Vestal; Peter M. Kogge; Gilbert C. Vandling, III, both of Endicott, all of N.Y.

[73] Assignee: International Business Machines Corp., Armonk, N.Y.

[21] Appl. No.: 800,652

[22] Filed: Nov. 27, 1991

Related U.S. Application Data

[63] Continuation-in-part of Ser. No. 659,199, Feb. 22, 1991, abandoned, Ser. No. 677,543, Mar. 29, 1991, abandoned, Ser. No. 748,316, Aug. 21, 1991, Pat. No. 5,404,461, Ser. No. 748,302, Aug. 21, 1991, Ser. No. 748,303, Aug. 21, 1991, Pat. No. 5,365,228, and Ser. No. 748,295, Aug. 21, 1991, Pat. No. 5,250,943.

[51] Int. Cl.⁶ .................................. H04J 3/02
[52] U.S. Cl. .................................. 370/85.6; 370/58.1; 370/60; 340/825.5; 340/825.51
[58] Field of Search ............... 370/85.6, 58.1, 94.1, 370/60, 68.1, 67, 58.2, 58.3; 340/825.5, 825.51; 455/53.1; 379/208, 161; 395/200

[56] References Cited

U.S. PATENT DOCUMENTS

| | | | |
|---|---|---|---|
| 4,213,201 | 7/1980 | Gagnier et al. | 370/62 |
| 4,408,300 | 10/1993 | Shima | 370/85.6 |
| 4,623,886 | 11/1986 | Livingston | 340/825.5 |
| 4,663,620 | 5/1987 | Paul et al. | 340/825.5 |

(List continued on next page.)

FOREIGN PATENT DOCUMENTS 8700373 1/1987 WIPO.
8702155 4/1987 WIPO.

OTHER PUBLICATIONS

IBM TDB, vol. 32, No. 4A, Sep. 1989, pp. 338–341. H. S. Stone 'Priority-Resolution Mechanism for Reducing Collisions in a Multiprocessor Interconnection Network'.

(List continued on next page.)

Primary Examiner—Douglas W. Olms
Assistant Examiner—Shick Hom
Attorney, Agent, or Firm—Eugene I. Shkurko; Lynn L. Augspurger

[57] ABSTRACT

A high priority path is added to the normal low priority path through a multi-stage switching network. The high priority path is established at the quickest possible speed because the high priority command is stored at the switch stage involved and made on a priority basis as soon as an output port becomes available. In addition, a positive feedback is given to the node establishing the connection immediately upon the making of the connection so that it may proceed at the earliest possible moment. The high priority path is capable of processing multiple high priority pending requests, and resolving the high priority contention using a snapshot register which implements a rotating priority such that no one requesting device can ever be locked out or experience data starvation. A dual priority switching apparatus with input port connections to output port connections uses as asynchronous means to resolve contention under low priority and the absence of blockage conditions, and switches automatically to a priority driven synchronous means of resolving contention under the pressure of blockage and high priority conditions. The protocol requires several parallel data lines plus four control lines so that the switching apparatus can be used for networks having a plurality of nodes, each node having a plurality of input and output ports, with a multiplexer control circuit for each output port for connecting any of I inputs to any of Z outputs, where I and Z can assume any unique value greater or equal to two. The switch has a single physical network path element over which either a low priority or high priority path can be established.

23 Claims, 13 Drawing Sheets

U.S. PATENT DOCUMENTS

| | | |
|---|---|---|
| 4,667,323 | 5/1987 | Engdahl ............... 370/85 |
| 4,670,855 | 6/1987 | Caprio ............... 364/900 |
| 4,679,190 | 7/1987 | Dias et al. ............... 370/60 |
| 4,731,878 | 3/1988 | Vaidya ............... 370/60 |
| 4,821,258 | 4/1989 | Fraser ............... 370/60 |
| 4,899,334 | 2/1990 | Shimizu ............... 370/60 |
| 4,952,930 | 8/1990 | Franaszek ............... 340/825.8 |
| 4,965,788 | 10/1990 | Newman ............... 370/60 |
| 5,079,762 | 1/1992 | Tanabe ............... 370/60 |
| 5,121,383 | 6/1992 | Golestani ............... 370/85.6 |
| 5,144,297 | 9/1992 | Ohara ............... 370/60 |
| 5,157,654 | 10/1992 | Cisneros ............... 370/60 |
| 5,189,666 | 2/1993 | Kagawa ............... 370/60 |

OTHER PUBLICATIONS

IBM Technical Disclosure Bulletin, vol. 34, No. 8, Jan. 1992, "SNL Switch And Its Control", pp. 16–21, published anonymously.

IBM Technical Disclosure Bulletin, vol. 27, No. 5, Oct. 1984, "Omega–Crossbar Network", pp. 2811–2816, by Pfister.

Proceedings Real Time Systems Symposium, Dec. 1988, "Support For High–Priority Traffic In VLSI Communication Switches", pp. 191–200, by Tamir et al.

IBM TDB vol. 33, No. 5, Oct., 1990, "Asynchronous Digital Video Switching System", by Farrell et al., pp. 227–233.

IBM Journal of Research and Development, vol. 31, No. 1, Jan. 1987 "Path Hierarchies in Interconnection Networks".

IBM TDB, vol. 32, No. 1, Jun. 1989 "Enhanced Means for Parallel Synchronization in . . . ".

IBM TDB, vol. 32, No. 4A, Sep. 1989 "Low–Cost Combining Switch That Implements A . . . ".

IBM TDB, vol. 32, No. 4A, Sep. 1989 "Priority–Resolution Mechanism for Reducing Collisions . . . ".

IBM TDB, vol. 32, No. 4A, Sep. 1989 "Parallel Synchronization with Hardware Collision . . . ".

IBM TDB, vol. 32, No. 8B, Jan. 1990 "Technique for Priority Resolution in Networks That . . . ".

IBM TDB, vol. 31, No. 9, Feb. 1989 "Data–Switching Network for a Magnetic–Disc Storage . . . ".

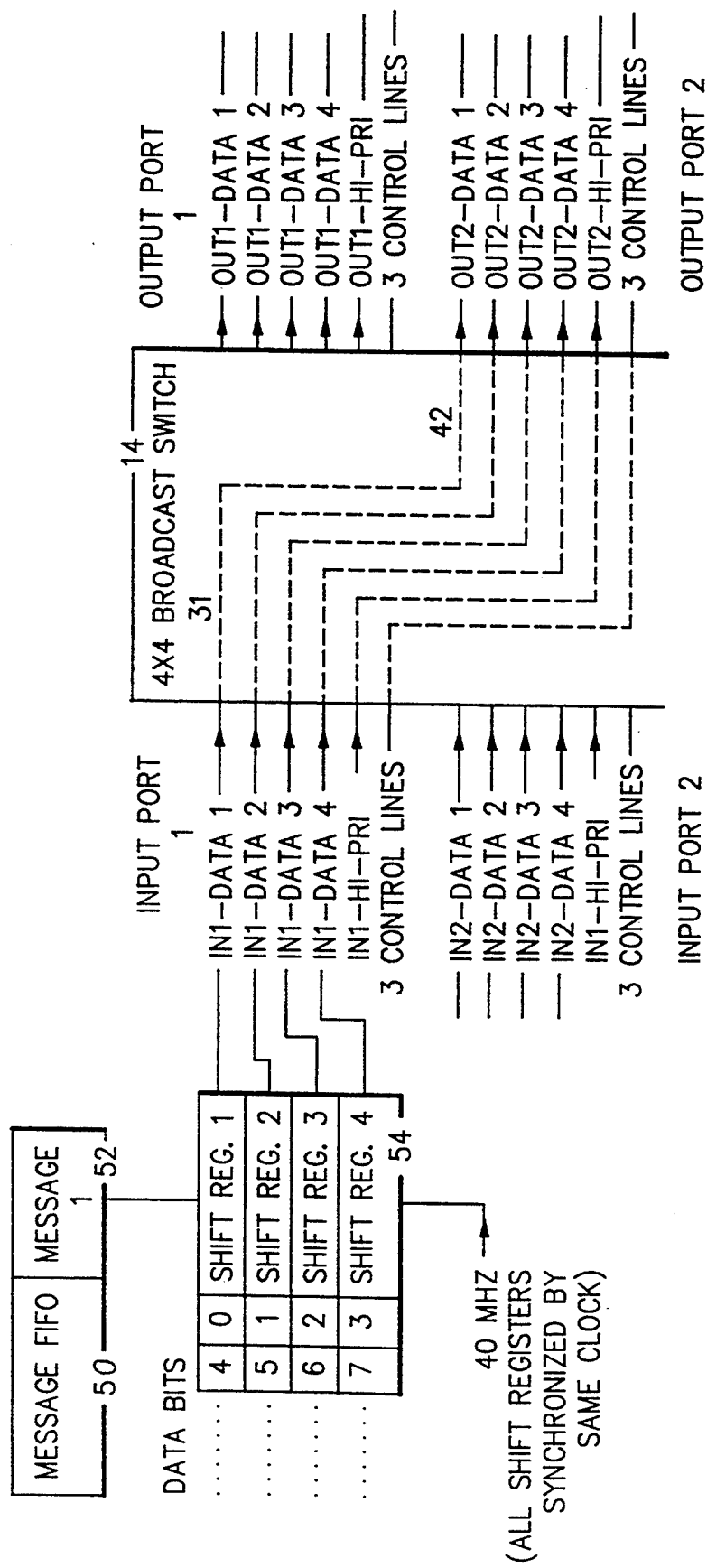

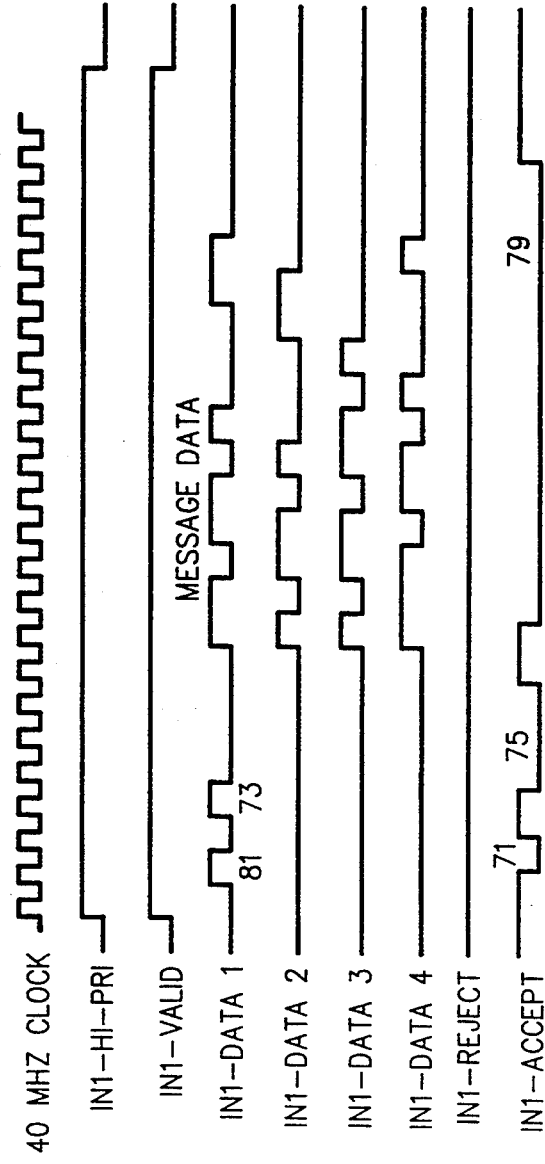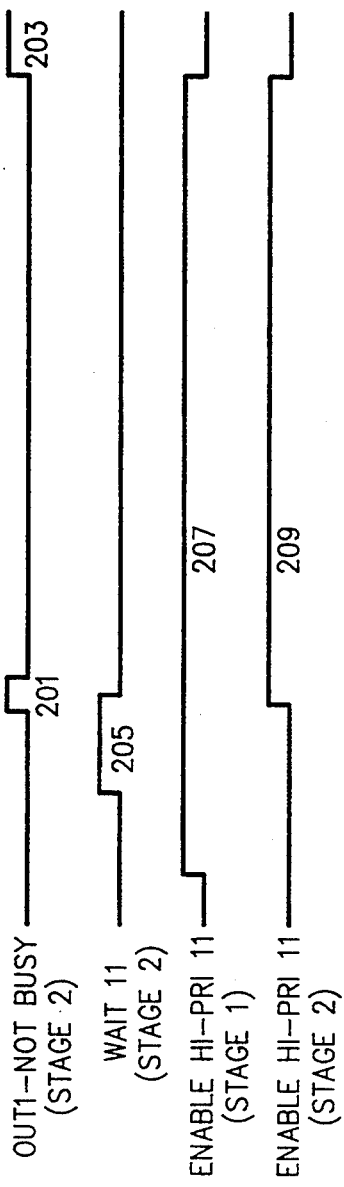
FIG.6

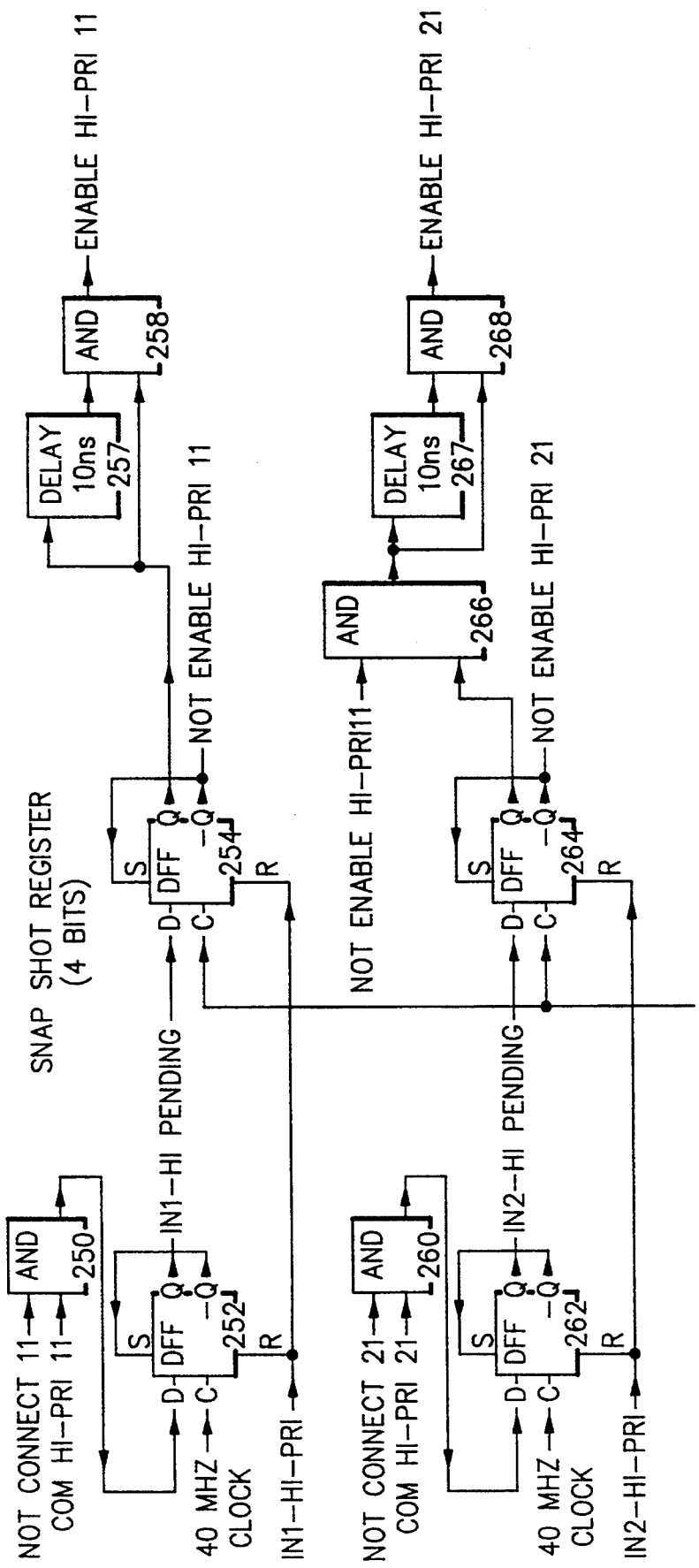

DUAL PRIORITY SWITCHING APPARATUS FOR SIMPLEX NETWORKS

CROSS REFERENCE TO RELATED APPLICATIONS

The present application claims priority and is a continuation-in-part of the following related co-pending Patent Applications:

"Asynchronous Low Latency Data Recovery Apparatus and Method", Betts et al, U.S. Ser. No. 07/659,199, filed Feb. 22, 1991.

"All-Node Switch, An Unclocked, Unbuffered Asynchronous Switching Apparatus" by P. A. Franaszek et al, U.S. Ser. No. 07/677,543, filed Mar. 29, 1991.

"Broadcast/Switching Apparatus For Executing Broadcast/Multi-Cast" by H. T. Olnowich et al, U.S. Ser. No. 07/748,316, filed Aug. 21, 1991, now U.S. Pat. No. 5,404,461.

"Multi-Sender/Switching Apparatus For Status Reporting Over Unbuffered Asynchronous Multi-Stage Networks" by H. W. Olnowich et al, U.S. Ser. No. 07/748,302, filed Aug. 21, 1991.

"Sync-Net—A Barrier Synchronization Apparatus For Multi-Stage Networks" by P. L. Childs et al, U.S. Ser. No. 07/748,303, filed Aug. 21, 1991, now U.S. Pat. No. 5,365,228, "GVT-Net—A Global Virtual Time Calculation Apparatus For Multi-Stage Networks" by P. L. Childs et al, U.S. Ser. No. 07/748,295, filed Aug. 21, 1991, now U.S. Pat. No. 5,250,943, and in addition, concurrently filed herewith are related applications:

"Priority Broadcast And Multi-Cast For Unbuffered Multi-Stage Networks" by H. T. Olnowich et al, U.S. Ser. No. 07/799,262, filed Nov. 27, 1991, now abandoned.

"Multi-Function Network" by H. T. Olnowich et al, U.S. Ser. No. 07/799,497, filed Nov. 27, 1991, now abandoned.

"Dynamic Multi-Mode Parallel Processor Array Architecture Computer System", P. Kogge, U.S. Ser. No. 07/798,788, filed Nov. 27, 1991, now abandoned.

"Multi-Media Serial Line Switching Adapter For Parallel Networks and Heterogeneous and Homologous Computer System", by H. T. Olnowich et al, U.S. Ser. No. 07/799,602, filed Nov. 27, 1991, now abandoned.

These co-pending applications and the present application are owned by one and the same assignee, namely, International Business Machines Corporation of Armonk, N.Y.

The descriptions set forth in these co-pending applications are hereby incorporated into the present application by this reference.

FIELD OF THE INVENTION

The inventions relate to multi-stage switching networks, and particularly to a system which uses unbuffered switching elements to comprise the multi-stage network. The invention applies equally well to either synchronous or asynchronous unbuffered networks.

BACKGROUND OF THE INVENTIONS

This application is directed to parallel processing switching networks and particularly to an improved multi-stage switch for interconnection of N system elements, where N can be several or thousands of computer processors or combinations of processors or other computer system elements. As a continuation, this disclosure relates specifically to an unbuffered switching system which operates asynchronously at each node of the network. With the improvements of this application the speed possibilities of the multi-stage switching network is improved by adding a high priority mode of interconnection in addition to the normal low priority mode of network interconnection, thus providing a single switching element to comprise a network capable of handling two different priorities of message transfers.

Multi-stage Switching Networks have become an accepted means for interconnecting multiple devices within a computer system. Often systems require multiple paths through the switching networks to perform different functions. In earlier work at IBM by Peter Franaszek entitled "Path Hierarchies in Interconnection Networks" (IBM Journal of Research and Development, Volume 31, Number 1, January, 1987), Franaszek described some of the problems associated with interconnection networks for high performance multiprocessor systems. In the paper it was a proposal of a network structure which optimized the delays of each network function by separation of the control flow from data flow and by transferring control information through a hierarchy of physical paths with varying speeds. The recommendation was for an implementation of a hierarchial control network utilizing a crosspoint chip.

Franaszek and Georgio continued this work with a patent, "Multipath Hierarchies in Interconnection Networks"; U.S. Pat. No. 4,952,930 issued Aug. 28, 1990, and described two hierarchical paths, one providing low-latency message transfer and the other providing guaranteed-delivery of a message transfer a longer latency.

A problem recognized in the work was that blocking in multistage networks, namely the limitations of data transfer delays between stages and contention resolution delays at each stage of a network have been substantial performance problems. In order to avoid or reduce the blocking, a hierarchical proposal of two networks only, each with a different latency period. The first network being unbuffered for low latency, and the second network being buffered for store and forward use would provide the guaranteed delivery of a message under all traffic conditions. A message is attempted over the low-latency path first. If the transmission fails due to blocking or contention, it is retransmitted over the guaranteed-delivery path. This allows usually about 90% of the messages to be sent successfully over the low-latency path, and guarantees the delivery of a message that gets blocked on the low-latency path due to retransmissions.

A problem arises with the use of multiple paths; i.e., as systems get larger and larger in terms of the number of devices that have to be interconnected, the massive amount of interconnects becomes a major problem and expense. Increasing the number of interconnecting networks becomes a major factor of two or more to provide for multiple paths vastly adds to this problem. It is not uncommon for modern parallel processors to be configured for hooking thousands of processors to thousands of memory modules; the interconnection problem for such solutions is immense.

We have solved some of the problems encountered in the prior art which we referred to above and will describe in the detailed description a way whereby multiple functions can be transmitted over the same network path.

In making our invention we recognize that others have tackled various problems in the network area. Some of this literature is discussed here.

U.S. Pat. No. 4,679,190, issued Jul. 7, 1987, to Dias et al, described a method of delivery of high priority messages in a multi-stage network using a multi-stage interconnection connector for voice and data packets. This patent relates to a different transmission scheme with synchronous, clocked, time-slotted transmission. There is no control by a Hi/Lo priority interface line, and the relatively complex method of performing priority and switch connections is different and applicable only to 2×2 sub-switches only. The priority levels were encoded on the data lines.

U.S. Pat. No. 4,821,258, issued Apr. 11, 1989 to Alexander G. Fraser described a packet switching system in which access to the same output bus, when there is contention, is determined by priority, permitting only one data packet token access to the single bus. This is a different telephone transmission scheme which is synchronous, clocked and time slotted, and not controlled by a Hi/Lo priority interface line. This is a buffered switch which requires data FIFO. The priority levels are encoded on the data lines, and there is a complex logic and switch addressing scheme required for implementation. The system has no capability to terminate from a sending device.

U.S. Pat. No. 4,667,323, issued May 19, 1987, to Engdahl et al. described a network with high and low priority messages on a single ring data path, but apparently also contemplated a similar function with trunk, star and ethernet topology. The scheme used station token holding, and no switch was involved. The present application relates to multi-stage switching networks.

Again one must understand that buses also have priority schemes. For instance, representative of such a bus priority scheme is U.S. Pat. No. 4,670,855, issued Jun. 2, 1987, to Caprio et al, described an interchangeable interface circuit card, which based upon priority, determines which one of a number of interchangeable interface circuit cards used for determining control of a common data path based on priority will be permitted to control the path.

U.S. Pat. No. 4,623,886, issued Nov. 18, 1986, to William D. Livingston described a network communication system with techniques for handling priority message transmission to ensure that higher priority data is transmitted before lower priority data with bus interface units which dynamically determine which information is used.

U.S. Pat. No. 4,213,201, issued Jul. 15, 1990, to Gagnier et al described generally a switching network for multistage systems in which a scheme for handling priority messages was used.

U.S. Pat. No. 4,663,620, issued May 5, 1987, to Paul et all described a modified crossbar switch in which a fixed priority conflict resolution is implemented together with random restrain on the side of (the) participating processors by implementing a threshold at each processor such that there exists a bias created in favor of the lowest priority processor of an effective parallel computer.

As the object includes a way to assign a different priority level to each of multiple functions, and to allow each function to be transmitted over the same path, it may be useful to review some of the IBM Technical Disclosure Bulletins which generally relate to switches. Token ring structures have been suggested in lieu of a tree to prioritize functions of a network. With the scheme of H. S. Stone, a combining switch was suggested to allow tree and token ring networks to manage a priority among nodes so that a network could detect one request from among N Messages, and broadcast that transaction to all processors by selection and broadcast. A detailed prioritization of request scheme was employed. A first publication was made in the IBM T.D.B. in H. S. Stone's work on synchronization of processors, and memories, and related switch work was also published in the IBM T.D.B. in Vol. 32. No. 1, June 1989, pp 281 et seq. as "ENHANCED MEANS (a fetch-and-add instruction) FOR PARALLEL SYNCHRONIZATION IN CROSSBAR SWITCHING NETWORKS".

This scheme was enhanced and published in the IBM T.D.B. of Vol. 32, No. 4A, September 1989, under the titles which included, pp 225 et seq. "LOW-COST COMBINING SWITCH THAT IMPLEMENTS A MULTIPROCESSOR JOIN". In that same IBM TDB in the article called "PRIORITY-RESOLUTION MECHANISM FOR REDUCING COLLISIONS IN A MULTI-PROCESSOR INTERCONNECTION NETWORK" H. S. Stone proposed, pp 338 et seq. a priority resolution mechanism in the form of a switching node which arbitrated requests for memory access according to a rotated order of memory module numbers. The Fetch-and Add synchronization instruction was discussed by Franaszek, Heidelberger and Stone on pp 259 of this Volume in the article called "PARALLEL SYNCHRONIZATION WITH HARDWARE COLLISION DETECTION AND SOFTWARE COMBINING".

The synchronization of parallel processors and memories continued to be discussed in the TDBs in Vol 32, under No. 8B, January 1990 in the article called "TECHNIQUE FOR PRIORITY RESOLUTION IN NETWORKS THAT SUPPORT PARALLEL SYNCHRONIZATION".

Data switching networks (such as that covered by the IEEE 896 'Futurebus) are applicable to many applications such as communications between processors in a multiprocessor system where a single bus is insufficient to carry the required traffic, and in parallel processing situations. The basic need for a solution was recognized in IBM Technical Disclosure Bulletin Vol. 31, No. 9, February 1989 by D. M. Taub—See "DATA-SWITCHING NETWORK FOR A MAGNETIC DISC STORAGE SYSTEM". However, the Futurebus technology contemplated required some sort of control acquisition arbitration scheme as described therein. This type of thing is inapplicable when the present class of improvements described here and in related applications is employed.

A problem existed in these prior art references in that in order to handle the needs of a few or thousands of processors with a switching network there is a requirement for the ability to dynamically and quickly establish and break element interconnections, to do it cheaply and easily, desirably in one chip. In order to have the expandability to many thousands of elements, to permit any length, with a non-calibrated interconnection of wire lengths, and to allow solutions to distributed processing systems, and allow for future frequency increases, it is necessary to design an apparatus which allows parallel establishment and data transfer over N switching paths simultaneously.

SUMMARY OF THE INVENTIONS

In the parent application we provided a switch called an ALLNODE switch which permitted the interconnection of multiple processors or other functional elements comprising a digital system on an as commanded basis. This provided a way to provide control and data to transfer between elements over a common and small set of point-to-point interconnecting wires.

Such a switching apparatus would be provided for a node having a plurality of input and output ports, and would comprise the connection control circuit for each input port, and a multiplexer control circuit for each output port for connecting any of I inputs to any of Z outputs, where I and Z can assume any unique value greater or equal to two.

In accordance with our inventions multiple functions are transmitted over the same network path by use of a new system switch which allows us to assign a different priority level to each function and allowing each to be transmitted over the same physical path.

Preferably such a system switching apparatus would be provided for a node having a plurality of input and output ports, and would comprise the connection control circuit for each input port, and a multiplexer control circuit for each output port for connecting any of I inputs to any of Z outputs, where I and Z can assume any unique value greater or equal to two, as in the parent application.

However, by the modifications made and illustrated herein, a dual priority multi-stage switch will be provided. The switch would allow for two priorities, and assign a different priority level to each function, and allow each function to be transmitted over the same physical single network path.

Accordingly, our dual priority switching system provides a multi-stage switching network system unbuffered switch to allow each node to have full control of the data it is transmitting; i.e. not to lose control of that data by having it reside somewhere in a buffered switch in the network. The system has a low priority node for receiving an input request for connection to a requested output port supporting contending request selection and for sending a reject signal to the requesting transmitting source element of the system if the requested output is or would be busy requiring reinitiation of the requesting message. The system also has a high priority node switch with more latency than the low priority node switch which reserves the requested path and does not reject a message. This high priority node may be used to provide a guaranteed delivery path.

For instance in regards to the example given above, the low-latency messages can be assigned to a low priority message level and the guaranteed-delivery messages can be assigned to a high priority message level. Then, by the means described herein, both messages types can be transmitted over the same path. This permits most of the multiple path goals to be accomplished without requiring any additional networks to perform the additional functions. The inventions allow hierarchical network functions to be formed over simplex paths.

The disclosure applies to message transmission through multi-stage networks. A network and protocol must be assumed here for the purpose of demonstrating the disclosure concept. The network switch and protocol chosen is described in detail in the co-pending application U.S. Ser. No. 07/677,543 referenced above; although the inventions herein could be considered as being applicable to most unbuffered network switches and protocols.

For a better understanding of the inventions, together with advantages and features, reference may also be had to the co-pending applications for some detailed background. Further, specifically as to the improvements described herein reference should be had to the following description and the below-described drawings.

BRIEF DESCRIPTION OF THE DRAWINGS

FIG. 3 shows illustrates a typical method for generating serial data information to be sent to the present invention over four data lines.

FIG. 6 is a timing diagram, which shows a typical example of how high priority paths are established sequentially at the first available instant through a two stage network comprised of dual priority switches.

FIGS. 7(A)–(B) show the detailed logic of the high priority switch function, which includes the snapshot register, register clocking, and high priority pending logic.

DETAILED DESCRIPTION OF THE INVENTIONS

Figure 1:
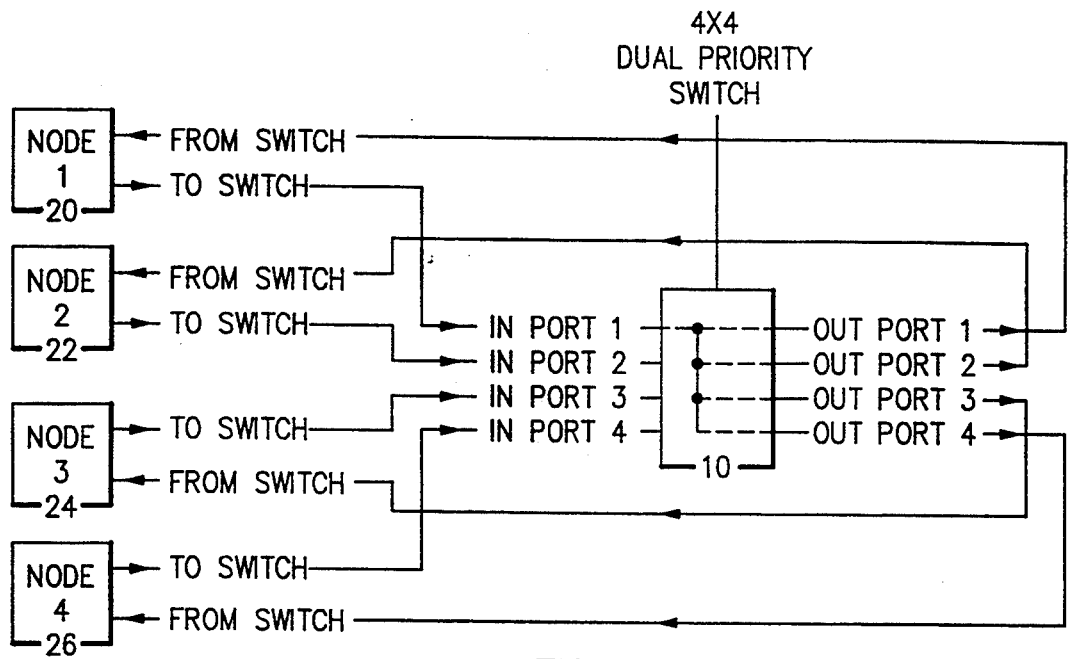
FIG. 1 illustrates generally our preferred embodiment of the present invention as a four-input (4×4) crossbar switching apparatus, which has control lines for handling the dual priority selection within the switch.

Turning now to the drawings in greater detail, as illustrated by FIG. 1, showing the preferred switch, the preferred switch shall be a 4×4 crossbar which operates asynchronously to transmit 4 bits of data in parallel FROM any of 4 input ports TO any of 4 output ports. Such a switch as shown in FIG. 1 is capable of supporting up to 4 simultaneous connections at any instant of time. The assumed switch shall be capable of operating in either of 2 modes—a low-priority mode or a high-priority mode. The description of the individual modes are given below.

It is here understood that the FIG. 1, FIG. 2, FIG. 3, and FIG. 4 contain elements in illustrations which are common with U.S. Ser. No. 07/677,543, the parent application which is incorporated herein by reference as to all of its contents. The disclosure made therein has been modified by the logic and timing of control signals which are illustrated by FIGS. 5, 6, 7, and 8.

As illustrated by FIG. 1 the preferred switching apparatus would be provided for a node having a plurality of input and output ports, and would comprise the connection control circuit for each input port, and a multiplexer control circuit for each output port for connecting any of I inputs to any of Z outputs, where I and Z can assume any unique value greater or equal to two, as in the parent application.

However, by the modifications made and illustrated herein, a dual priority switch will be provided for consistent operation in a multi-stage network. The switch would allow for two priorities, and assign a different priority level to each function, and allow each function to be transmitted over the same physical single network path.

The preferred embodiment is a 4×4 crossbar switching apparatus, where the function of the present invention is to provide a means of connecting any of four input ports on a mutually exclusive basis to any one of the unused four output ports on a priority basis.

The 4×4 crossbar switching apparatus can support up to four simultaneous connections at any given time. For instance, Input 1 could be connected to Output 3, Input 2 to Output 4, Input 3 to Output 2, and Input 4 to Output 1.

Figure 2:
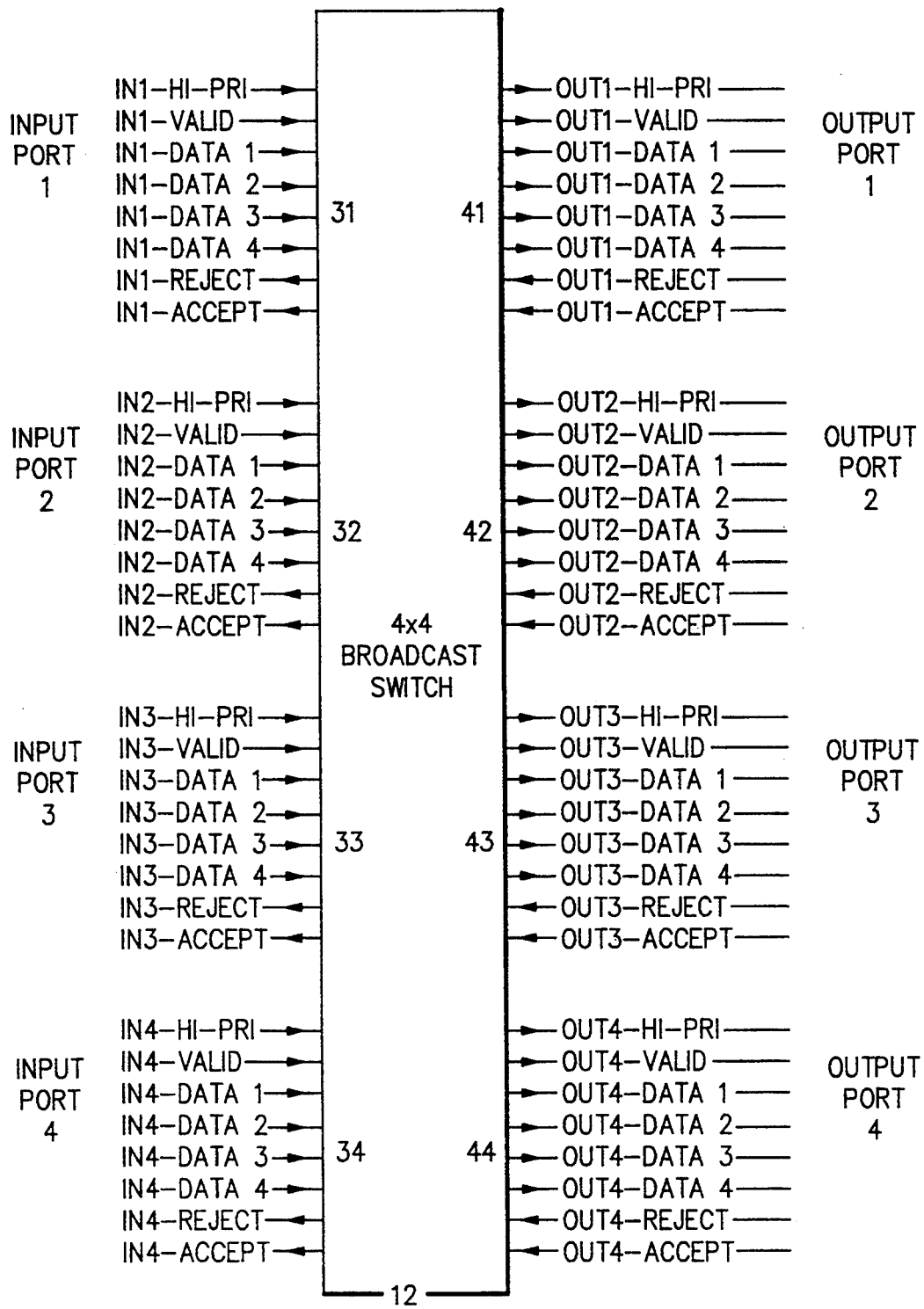
FIG. 2 shows in more detail, as illustrated also in the prior parent application U.S. Ser. No. 07/677,543, the detailed schematic of the 4×4 crossbar switching apparatus and its interface connections.
Figure 5A:
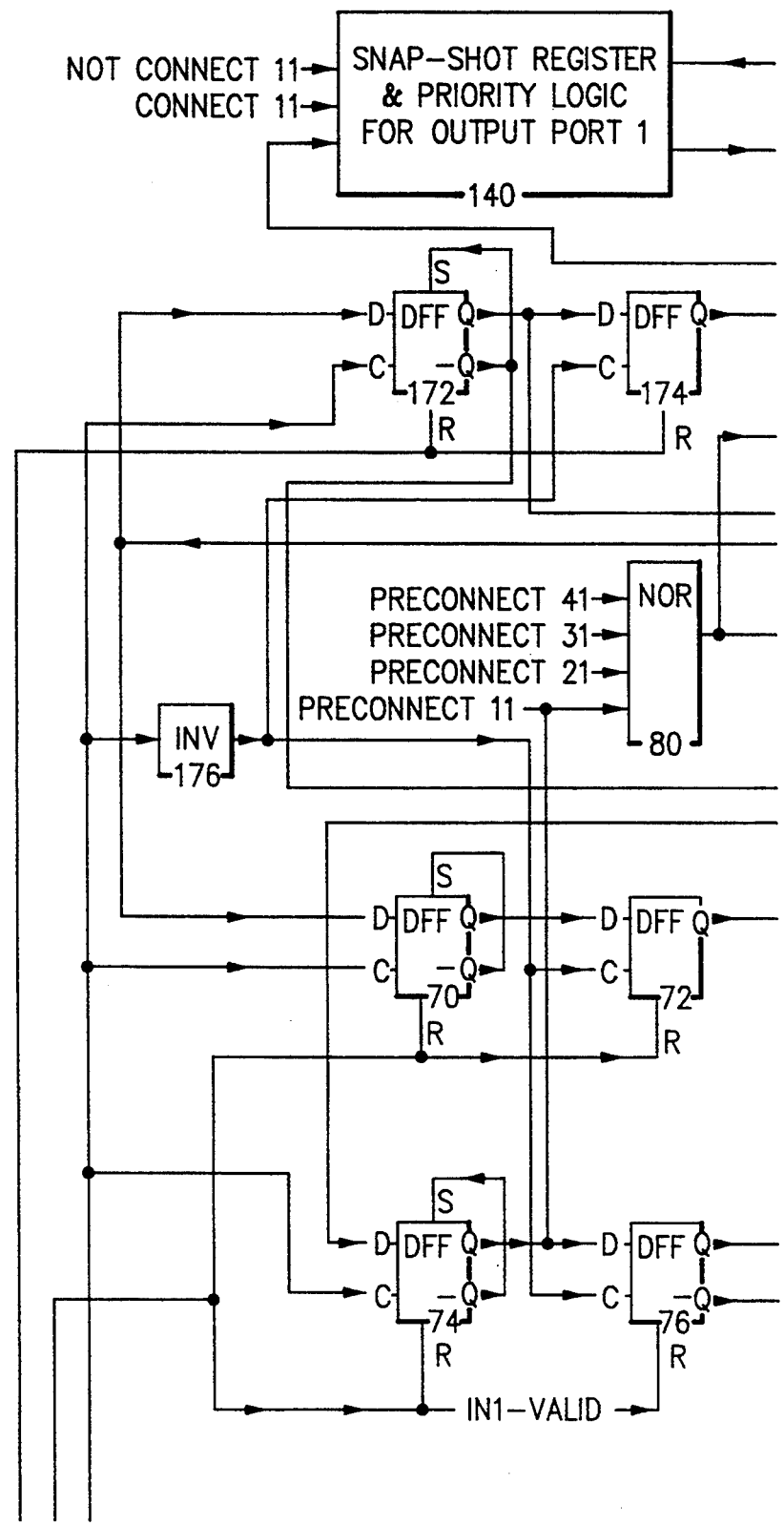
FIGS. 5(A)–(F) illustrate our preferred embodiment of the dual priority switch by showing a typical implementation of high and low priority paths between a given input port and a given output port of the dual priority switch.
Figure 5B:
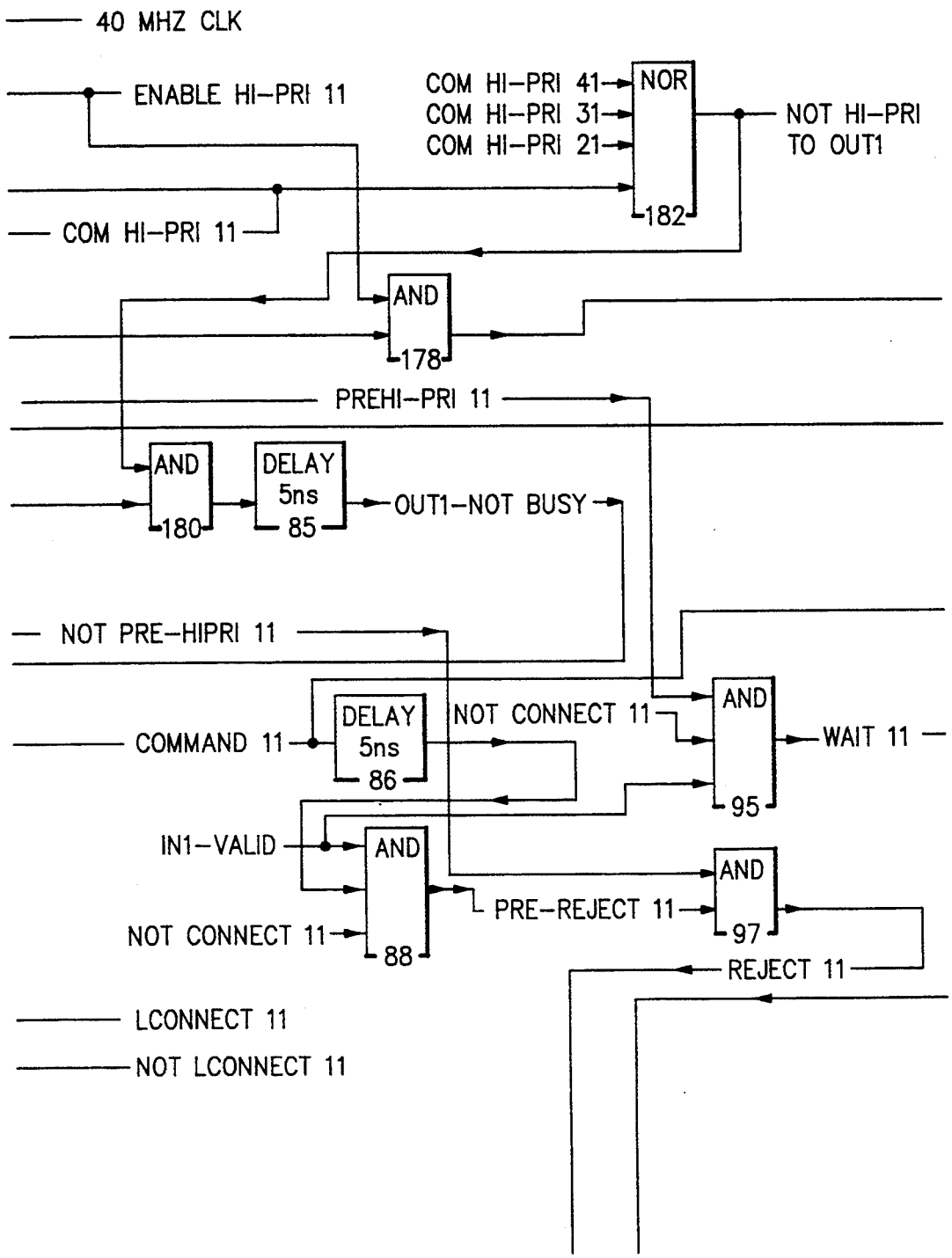
Figure 5C:
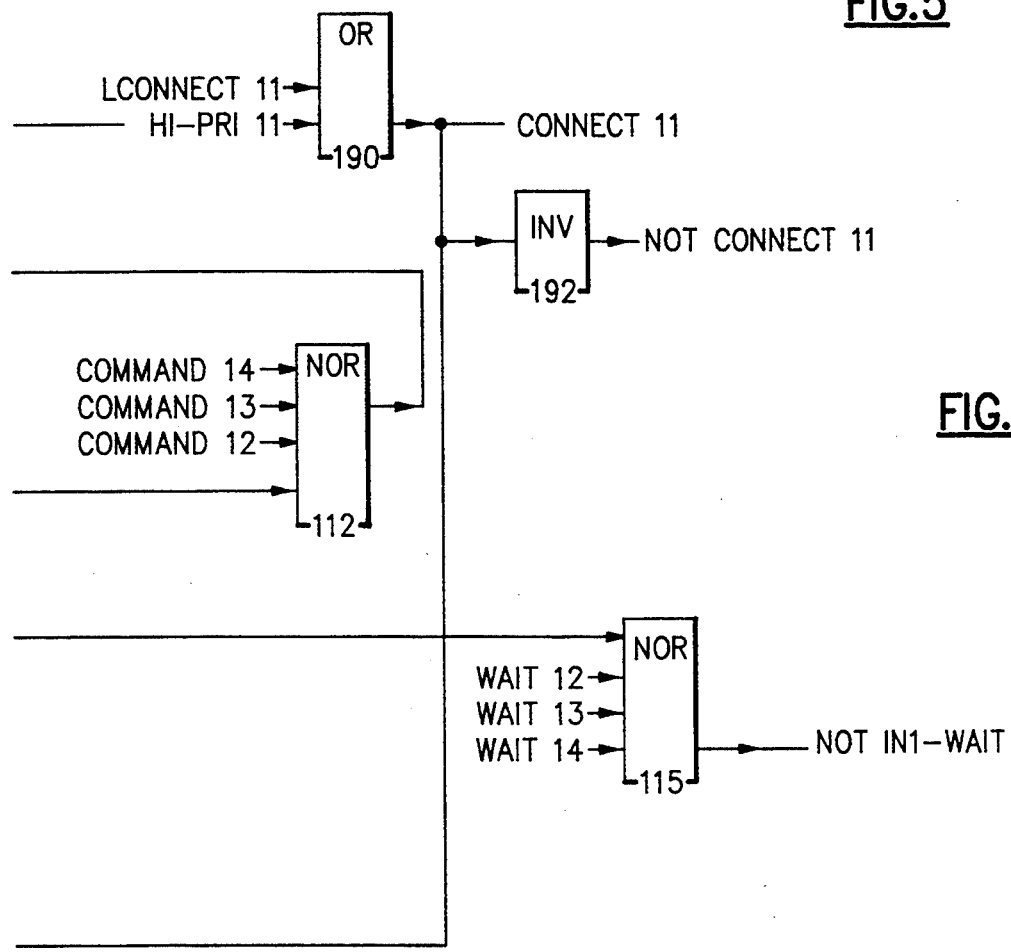
Figure 5D:
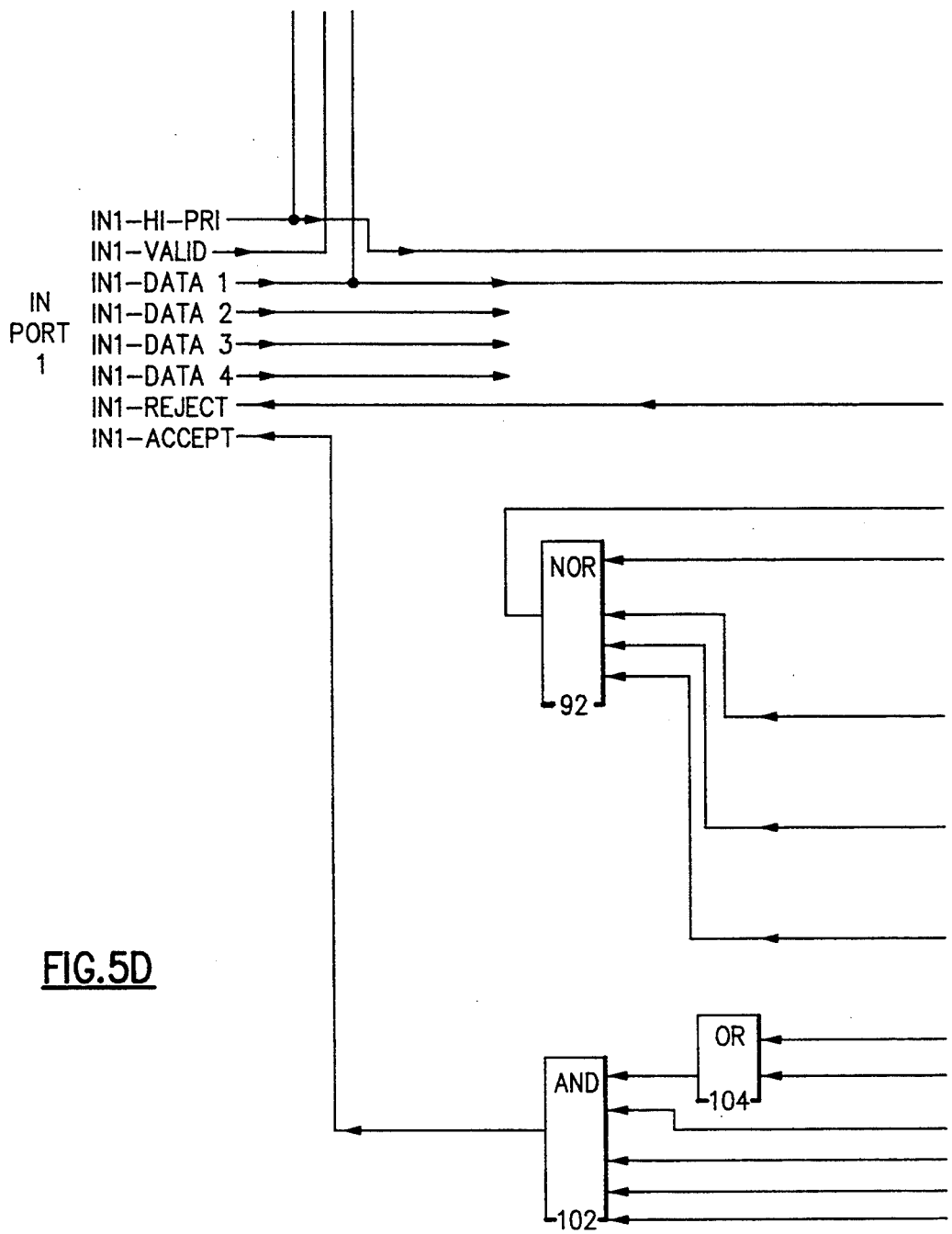
Figure 5E:
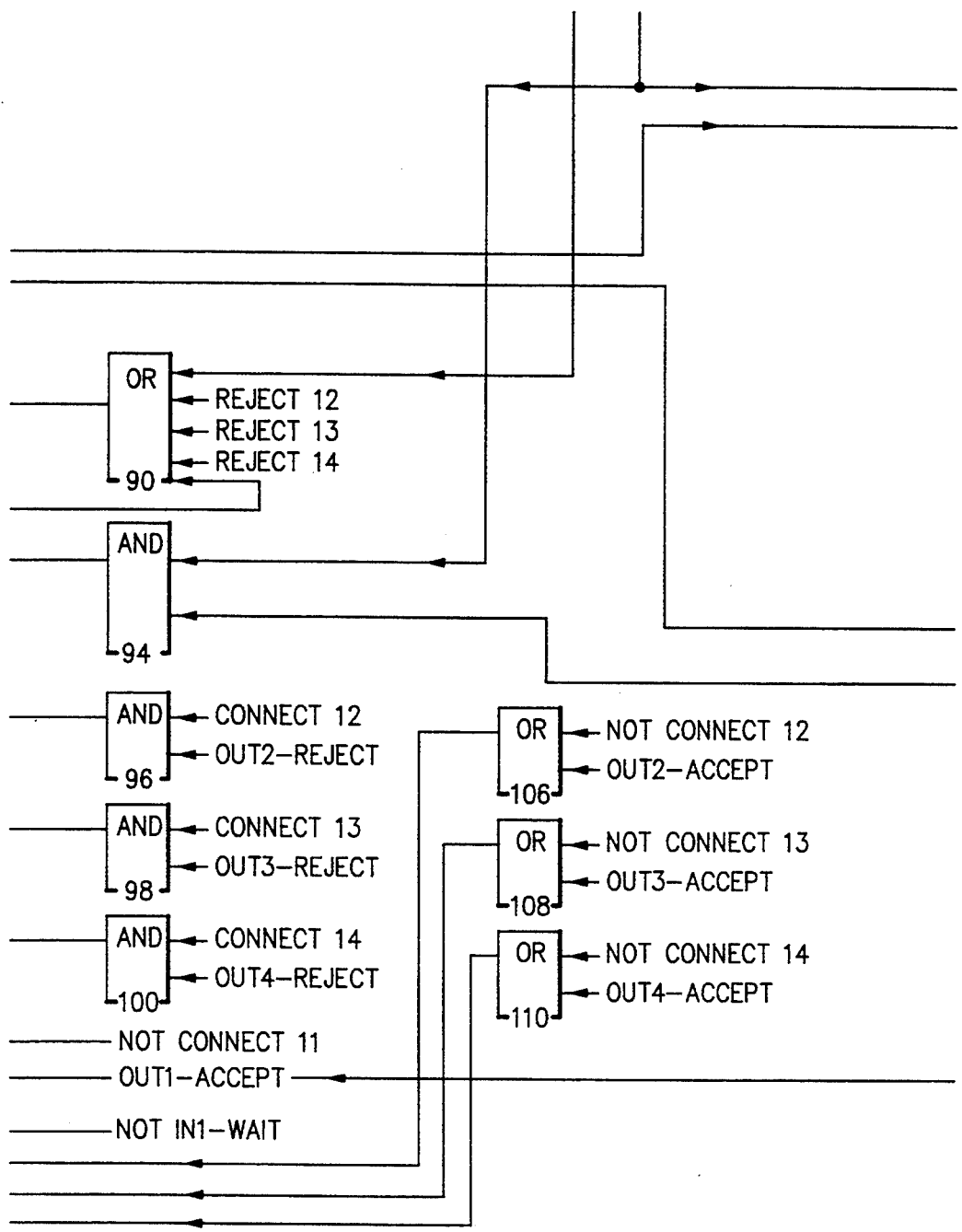
Figure 5F:
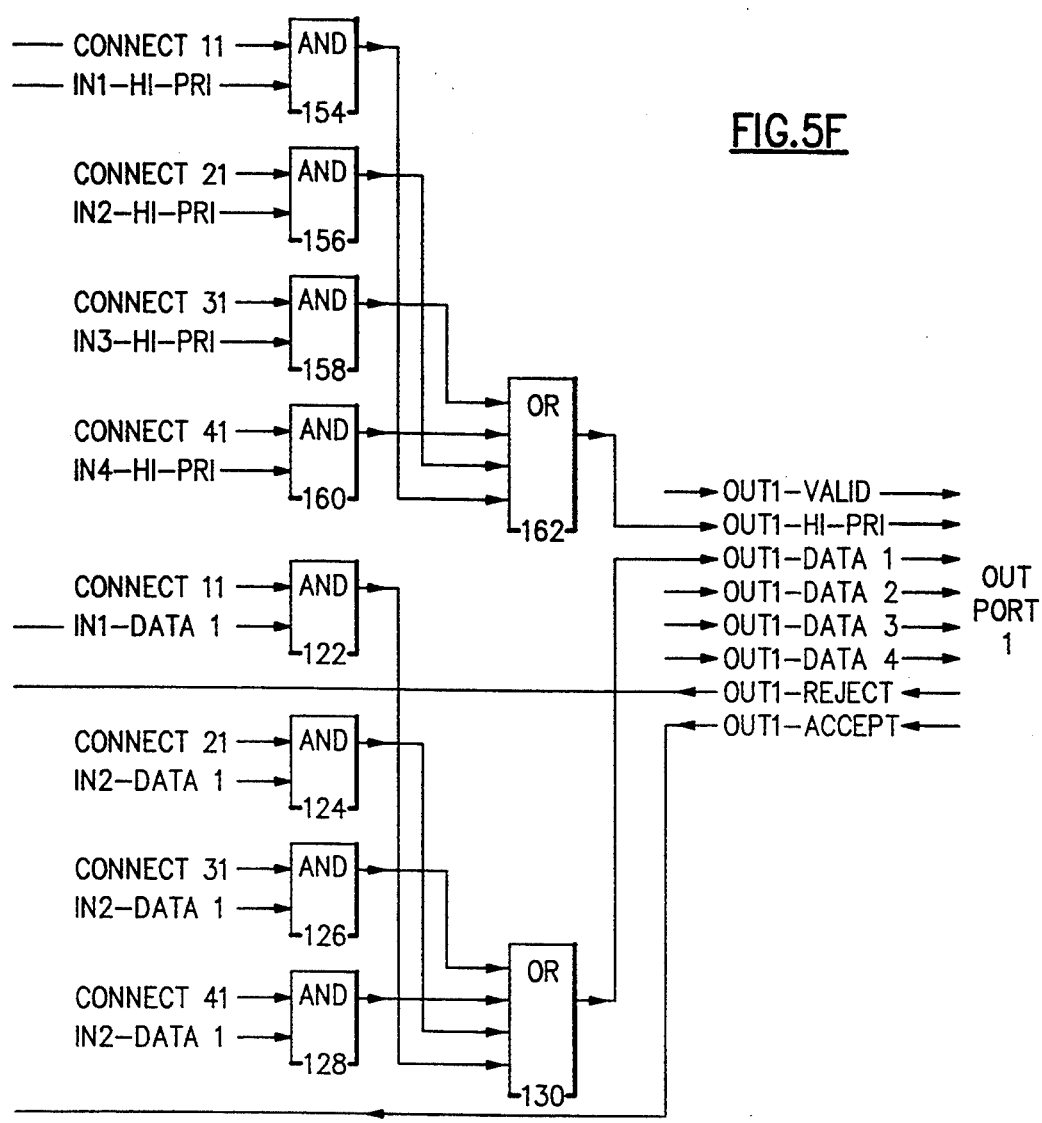

The invention switching apparatus 10 is unidirectional, which means that data flows in only one direction across the said switching apparatus 10, that being from input to output. Although the said switch apparatus 10 is unidirectional, it supports bidirectional communication amongst four nodes (20, 22, 24, and 26) by connecting the 4×4 ALL-NODE switching apparatus 10 as shown in FIG. 1. Each node 20, 22, 24, and 26 has two sets of unidirectional interconnecting wires, one going to the switch 10 and one coming from the switch 10. The dashed lines internal to the switching apparatus 10 indicate that the function of the said switching apparatus is to connect an input port such as INPUT PORT 1 to one of four possible output ports. The switching apparatus 10 provides exactly the same function for each input port, allowing it to be connected to any unused output port. As illustrated by FIG. 2 the switch 12 has four data bit inputs and four control inputs. A new high priority (HI-PRI) interface control line is added to the basic ALLNODE switch design to implement the new dual priority function. In addition, the VALID and REJECT control signals remain, as well as the ACCEPT line which becomes mandatory line.

Referring thus to FIG. 2, block 12 shows an expanded drawing of switching apparatus 10 and defines in detail the interface lines connecting to switching apparatus 10. The set of lines 31, 32, 33, and 34 at each in-port to the switching apparatus 12 are identical in number and function to the set of lines 41, 42, 43, and 44 at each out-port. The sets of interface lines to each input and output port contain eight unique signals: four data lines and four control lines (VALID, REJECT, ACCEPT, and HI-PRI (High Priority) which are differentiated by a prefix of INX- or OUTX- indicating the direction and number of the port (X) that they are associated with. The four data and VALID and HI PRI lines have a signal flow in the direction going from input to output across switching apparatus 12, while the REJECT and ACCEPT control lines have a signal flow in the opposite direction.

The sets of input port interface lines 31, 32, 33, and 34 transfer control information to switching apparatus 12 for the purpose of commanding and establishing input port to output port connections internal to the said switching apparatus. In addition, the said port interface lines also carry data information to be transferred from input port to output port across the switching apparatus 12. The four data interface lines contained in interfaces 31, 32, 33, and 34 do not restrict the transfer of data across switching apparatus 12 to only four bits of information, but rather the said four data lines can each contain a string of serial data making the transmission of any size data possible. For example, the said four data lines could transfer data at a 160 Mbits/sec rate, if all four data lines were transmitting serial data at a 40 MHZ rate.

The Switch Interface requires only 8 signals, as shown in FIG. 3, to transmit and control dual priority data through the network—the data transfer width is ½ byte (4 bits) at a time. The signals required are:

DATA: 4 parallel signals used to command switch connections and transmit data messages.

VALID: When active, indicates that a message is in the process of being transmitted. When inactive, indicates a RESET command and causes all switches to reset to the IDLE state. All switch functions are reset, except the high priority latches.

HI-PRI: When active, indicates the message in process is in high priority mode. When inactive, issues a TERMINATE high priority command and causes all associated high priority latches to reset.

REJECT: Signal flow is in the opposite direction from the other 6 signals. When active for a low priority transfer, it indicates that a REJECT condition has been detected. For a HP mode operation, it has no meaning.

ACCEPT: Signal flow is in the same direction as the REJECT signal and opposite to that of the other 6 signals. When in the low state, it indicates that a WAIT condition has been detected and a high priority connection cannot be made at this time. When in the high state, it indicates that the WAIT condition has ended and the commanded high priority connection has been established.

Referring to FIG. 3, blocks 50, 52, and 54 illustrate a typical method for generating serial data in the form of a message which can be transmitted to and across switching apparatus 14, which is a partial drawing of the switching apparatus 12. Similar serial data generation logic as provided by 50, 52, and 54 can be used at each of the other input ports to switching apparatus 12. Each set of input data lines provides serial data to a given input port which is synchronized to the same clock by the four shift registers 54 which create serial data by shifting four synchronized lines of data 31 as controlled by the same identical clocking signal (40 MHZ in FIG. 3). However, the four different input port sources (31, 32, 33, and 34) to switching apparatus 14 can be asynchronous to each other, being based on different, non-synchronized, 40 MHZ clocking signals.

The process for sending serial messages through switching apparatus 14 involves FIFO 50, which accumulates data messages to be transmitted. The next entire message to be transmitted is moved to buffer 52. The message stored in buffer 52 is moved to shift registers 54 in preparation for transmittal and the data is dispersed across the four shift registers 54 by placing data bit 0 into the first bit of shift register 1, data bit 1 into the first bit of shift register 2, data bit 2 into the first bit of shift register 3, data bit 3 into the first bit of shift register 4, data bit 4 into the second bit of shift register 1, etc. Shift registers 54 then begin to send serial data to switching apparatus 14 over four synchronized data lines, in such a manner that the serial data flows continuously until the entire message has been transmitted. The switch apparatus 14 uses the first eight bits transmitted (in the first two clock cycles of serial data over interface 31 from serial registers 54 to switching apparatus 14) to select and establish a connection path through the switching apparatus 14. The example in FIG. 3 illustrates via dashed lines, the switching apparatus establishing a temporary connection between input port 1 (31) and output port 2 (42), such that each of the seven individual lines in interface 31 are uniquely and directly connected to each of the corresponding lines in interface 42.

Figure 4:
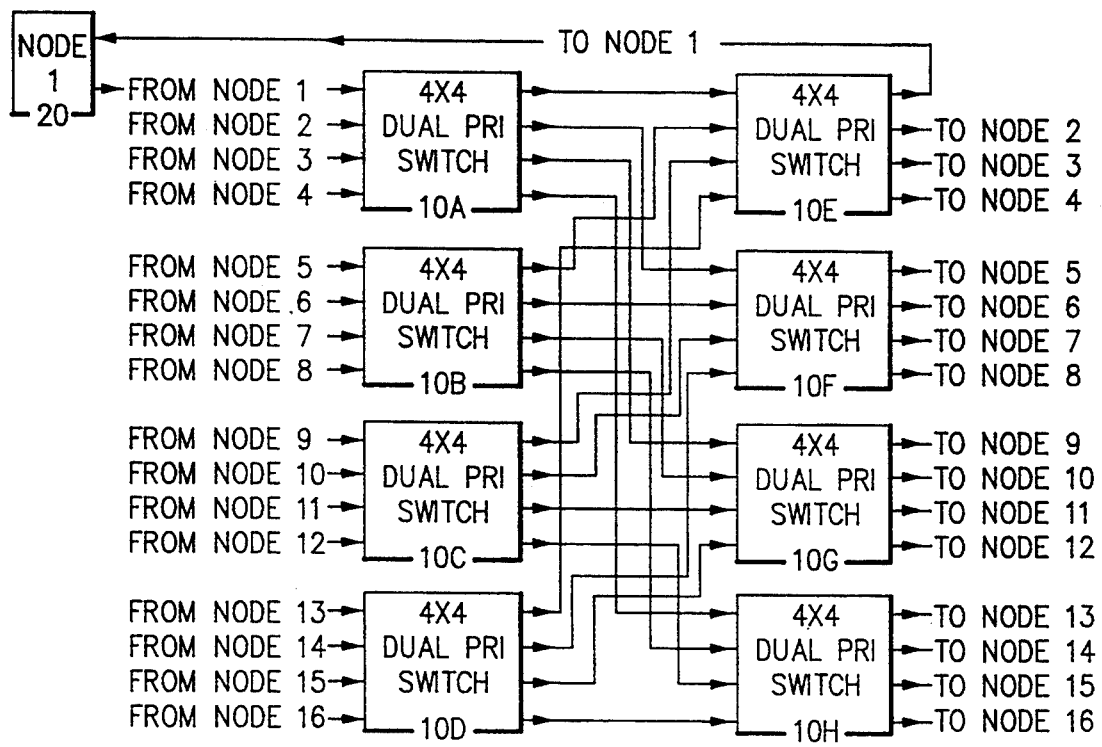
FIG. 4 shows a typical method for cascading the preferred 4×4 switching apparatus to accommodate systems having more than four nodes.

Referring to FIG. 4, a method is illustrated for increasing the number of nodes in a system by cascading eight switching apparatus 10 blocks. The eight cascaded switches are denoted as 10A through 10H to indicate that they are identical copies of switching apparatus 10, varying only in regards to the wiring of their input and output ports. It can be noted that any of sixteen nodes can communicate to any other node over a connection that passes through exactly two of the switching apparatus 10 blocks. For instance, Node 5 can send messages to Node 15 by traversing switch 10B and switch 10H.

Since all connections are made through two switching apparatus 10 blocks, the network comprised of the eight switching apparatus 10 blocks is referred to as a two stage switching network. Other multi-stage networks can be configured from switching apparatus 10 blocks by using three stages, four stages, etc. in a similar manner. The number of nodes possible to interconnect with this type of network can become very large; however, for simplicity the network in FIG. 4 will be assumed throughout this disclosure, since it typifies the characteristics of larger networks.

In the low-priority mode the switch will be capable of receiving commands from each input port, commands that can arrive asynchronously and request connection to a specific output port. If the requested output port is available (NOT BUSY; i.e., not being used to support a previously commanded connection), the command shall be executed and the connection established. If the output port is BUSY, the command shall be rejected and the input port will return to the IDLE state (i.e., ready to accept any subsequent command it receives). This rejected connection in the low priority mode is referred to as a KILL operation because the entire path in the network is broken down or KILLED, if any pad of the complete path can not be established.

Switches can be cascaded together to form networks larger than the 4×4 interconnection scheme supported by an individual switch. FIG. 4 shows how this is done by connecting an output port from one switch to the input port of a second switch. A possible occurrence in this larger network is that the initial switches establish valid connections and a subsequent switch is BUSY and thus issues a REJECT. The REJECT indication then gets sent in the reverse direction back to the previous switch's output port—which has already established a valid connection. In this case, the switch shall dissolve its valid connection and indicate this action by sending a REJECT signal to the input port to which it was previously connected. In turn, the input port will issue a REJECT to its source and then return to the IDLE state. This approach is called KILL, because a REJECT sequence causes all previously established connections to be broken or KILLed and everything in the KILL path to be returned to the idle state. Also, any portion of the message whose transmission has been initiated is completely lost or KILLed and any retransmission of the message must be reinitiated from the very beginning.

If 2 or more of the input ports receive commands simultaneously and contend with each other to establish connection to the same NOT BUSY output port, the lower numbered input port shall win the contention, make the connection desired, and the other contenders shall be rejected and their connections KILLED. Accordingly, it will be seen that the low-priority path through the simplex network uses the KILL function. If rejection occurs in any pad of the path, the entire path is broken down immediately and the message must be retransmitted from scratch.

Initially a message transmitted in the high priority mode has the same reaction at the switch as a message transmitted in the low priority mode. If the output port requested is NOT BUSY—a valid connection is established on a first-come, first-serve basis; or the lower numbered input is selected if multiple inputs contend simultaneously for a NOT BUSY output. However, the high priority mode performs an additional function in that it sets a special high priority pending latch, which inhibits the issuing of REJECT in response to a blocked connection, but instead holds that connection pending at the switch until the blocked connection becomes available. Then, it immediately makes the pending connection and issues a positive feedback to the requester. The pending connection cannot be lost or lose its priority unless it is terminated by the message source.

Instead of a REJECT response, the high priority mode issues a WAIT response, if a connection cannot be made. The WAIT response consists of driving the ACCEPT signal to zero and holding it at a zero for the duration of the WAIT condition. When the pending connection is made, the ACCEPT signal is driven to a logical 1 as a positive indication that the WAIT state is over. When the node requesting a connection senses a WAIT response, it temporarily pauses its message transmission and continues from where it left off when the WAIT condition subsides. Thus, in the high priority mode, the transmitting node doesn't retransmit a blocked message from the beginning, like it does in the low priority mode, but instead just pauses and continues when ACCEPT rises. The timing is such that the transmitting node receives the ACCEPT indication to continue at the earliest possible moment, thus allowing the high priority message to be transmitted at the earliest possible time. In addition, all stages previous to the blockage (in which connections were previously won) are held for the duration of the WAIT period and never have to be re-established again for the high priority message in progress. Thus, it provides for the guaranteed delivery of a high priority message through a network at the quickest possible time.

If more than one high priority message is waiting for the same output port to become available, the message associated with the lowest numbered input port gets connected first—while the others continue to WAIT in a snapshot register. After all requests waiting in the snapshot register have been serviced, the register is allowed to load again if more high priority requests are pending. The snapshot register gives all requesters an equal chance to make a connection to an output port, before any given requester can be service a second time. Thus, it provides a method via the high priority path through a network to prevent any given requestor from being completely blocked from the network and experiencing starvation.

It is possible for larger networks that the initial switches establish valid connections, while a subsequent switch detects a WAIT condition. In this case, the WAIT indication is transmitted in the reverse direction to the previous switch—which doesn't break its connection, but merely propagates the WAIT indication in the reverse direction. This recurs at all previously connected switches until the WAIT gets propagated all the way back to the message source.

It is possible for the source to reset all the high priority path at any time by returning the HI-PRI to the zero state. The source does have the ultimate control over the network.

Referring to FIG. 5, the detailed logic implementation is shown for a portion of the invention dual priority switching apparatus, the said portion being the typical circuitry required to establish a single low priority or high priority data transfer connection between one input port (such as input port 1) and one output port (such as output port 1) of the preferred 4×4 dual priority switching apparatus 10 embodiment. Latches 70, 72, 74, and 76 control the normal low priority path and their operation is explained in detail as to how they implement the low priority path and how a connection in the switch is broken (KILLED) when a REJECT is encountered in "All-Node Switch, An Unclocked, Unbuffered Asynchronous Switching Apparatus" by P. Franaszek et al., U.S. Ser. No. 07/677,543, filed Mar. 29, 1991.

The new implementation disclosed for the present invention is an addition to the basic ALLNODE Switch logic of a second high priority path for implementing the guaranteed delivery function. The disclosed new logic is comprised of latches 172, 174, block 140, delay block 84, gates 178, 182, 78, 95, and 115, plus a new interface control signal at every port—such as IN1-HI-PRI at Input Port 1 and OUT1-HI-PRI at Output Port 1 as shown in FIG. 5. The functional operation of these said logic components will be described in detail in this present disclosure.

Referring to FIG. 6, the timing sequences generated by the node attached to Input Port 1 are shown. FIG. 6 defines the signal sequences that Input Port 1 uses to command a new high priority connection of Input Port 1 to Output Port 1 through the dual priority switching apparatus. The operation starts by Input Port 1 activating the IN1-HI-PRI and IN1-VALID interface control lines simultaneously to a logical one. The IN1-HI-PRI signal controls the high priority logic path in FIG. 5, and its activation to a logical one removes the reset from latches 172 and 174 and enables them.

The next occurrence, as shown in FIG. 6, is a command pulse 81 on IN1-DATA 1 interface line that commands Input Port 1 to make a high priority connection to Output Port 1; the command is specified by the IN1-HI-PRI being active to define that it is a high priority connection and by the pulse 81 being on IN1-DATA 1 line which defines that the connection is to be to Output Port 1. When pulse 81 is on IN1-DATA 2 line, it defines that the connection is to be made to Output Port 2, IN1-DATA 3 defines connection to Output Port 3, etc. Pulse 81 being on IN1-DATA 1 in the example shown in FIG. 6 causes latch 172 to set on the rise of pulse 81 and latch 174 to set on the fall of pulse 81. Latch 174 being set causes the dual priority switch to latch the fact that it has received a COMmand to make a HI-PRIority connection from Input Port 1 to Output Port 1 as defined by the COM HI-PRI 11 signal from latch 174. Latch 172 being set causes the PREHI-PRI 11 signal to activate, which in turn causes AND gate 95 to go active creating the WAIT 11 signal. The WAIT 11 signal is sent through NOR gate 115 (where it is inverted) to AND gate 182, where it is driven back to node 1 over the IN1-ACCEPT line causing pulse 71 as shown in FIG. 6. Pulse 71 gives a positive acknowledgement to Input Port 1 indicating when the commanded connection has been established. As long as the WAIT 11 signal is active, the dual priority switch is waiting to make the connection and has not been successful yet at making the connection. When the connection is made successfully, the WAIT 11 signal goes inactive and passes through gates 115 and 182 to cause the IN1-ACCEPT signal to rise, thus completing pulse 71 and giving a positive feedback to Input Port 1 that the connection has been made. Pulse 71 shows the fast possible connection time where the connection is made quickly (within the duration of pulse 81) such that pulses 81 and 71 are of the same duration with pulse 71 being delayed by the path it takes through the logic shown in FIG. 5.

The COM HI-PRI 11 signal also goes to NOR gate 182, where it is NOR'ed with other similar signals from the other input ports, any of which will propagate through gate 180 and delay block 85 to cause Output Port 1 to appear BUSY. This will cause all low priority requests for Output Port 1 to be rejected immediately until all the high priority requests for Output Port 1 have been serviced.

The making of high-priority connections to Output Port 1 are controlled through logic block 140, which receives commands from latch 174 and similar latches related to the other Input Ports and determines the priority in which these connections will be established. When it decides that Input 1 is the highest priority requester for Output 1, block 140 will activate the "Enable HI-PRI 11" signal—thus informing the dual priority switch to make the connection at this time. The detailed operation of block 140 is described later in relation to FIGS. 7 and 8. The "Enable HI-PRI 11" signal being activated as shown by 207 goes to AND gate 178 where it will be inhibited from propagating any further if a low priority connection is presently active to Output Port 1 as detectable by a latch like 74 being active through NOR gate 80. However, the normal case is that NOR gate 80 does not block the "Enable HI-PRI 11" signal at gate 178 and allows it to pass through and activate the "HI-PRI 11" signal immediately or as soon as the low priority connection is broken. The "HI-PRI 11" signal is OR'ed with the low priority signal (LCONNECT 11) in gate 190 to generate a composite signal CONNECT 11 defining to the dual priority switch to make the connection of Input Port 1 to Output Port 1. The Connect 11 signal is inverted in gate 192 and goes to gate 95 where it causes the WAIT 11 signal to go inactive.

The CONNECT 11 signal is also used to establish the direct connection of six interface lines between input port 1 and output port 1. The four data lines of input port 1 become connected to the four data lines of output port 1. The details of a typical connection are shown by AND gate 122 and OR gate 130. CONNECT 11 going active to AND gate 122 causes the output of AND gate 122 to follow directly the values on IN1-DATA1, which is gated through OR gate 130 to OUT1-DATA1. The other AND gates 124, 126, and 128 feeding OR gate 130 will all be held to logical 0's and have no effect on gate 130; this is because normally only one CONNECT signal can be active at any given time, thus enabling a single connection to a specified output port. Therefore, if CONNECT 11 is active to gate 122, CONNECT 21, CONNECT 31, and CONNECT 41 to gates 124, 126, and 128, respectively, must all be inactive. In similar fashion the IN1-HI-PRI and IN1-VALID lines are also connected from Input Port 1 to Output Port 1 based on the CONNECT 11 signal. A typical connection is shown for the IN1-HI-PRI line through gates 154 and 162. The result being that all 6 input signals present on Input Port 1 get connected directly to the same signals at Output Port 1, going directly through the dual priority switch through only 2 gates, such as 154 and 162, and without being buffered, such that the pulse forms appearing on Input Port 1 appear instantaneously on Output Port 1 experiencing only a slight delay caused by the 2 logic gates (like 154 and 162) that they pass through. There is one slight exception where the Input PORT 1 waveforms shown in FIG. 6 differ from the output waveforms; that is pulse 81 is stripped from the input waveform and stored in latch 174 and it is not passed to the Output Port 1. There are 2 reasons for this: 1) By the time the CONNECT 11 signal goes active, pulse 81 is gone and cannot be passed to the Output Port 1. 2) Pulse 81 defines the first stage switch connection to be made and has not other meaning, therefore it is not desirable to pass pulse 81 any further into the network.

Two feedback signals from Output Port 1 to Input Port 1 also have connections established at the time the CONNECT 11 signal becomes active. AND gate 94 shows CONNECT 11 selecting OUT1-REJECT as the source of the IN1-REJECT signal through NOR gate 92 and OR gate 90. The ACCEPT signals from all four output ports come into gates 104, 106, 108, and 110, respectively, and are ANDed together by gate 102. The individual monitoring of the four OUTx-ACCEPT signals is enabled by the inverse of their corresponding CONNECT signals, shown typically by gate 192 generating NOT CONNECT 11 going to gate 104.

In a multi-stage network, pulse 71 going away indicates that the first stage switch in the network has made its connection. The next step is to command the second stage network switch to make its connection by issuing pulse 73 on IN1-DATA 1 as shown in FIG. 5. The example assumes a two stage network shown in FIG. 4 and that the second stage switch logic, like the first, is identical to the logic shown in FIG. 5. The second stage is commanded to make the exact same high priority connection as the first stage of Input Port 1 to Output Port 1 by the presence of pulse 73 on the IN1-DATA 1 line. Note that switch stage two becomes connected to switch stage 1 by the CONNECT 11 signal as described above and causes switch stage 2 to see the exact same waveform as seen by stage 1 as shown in FIG. 6, except that stage 2 does not see pulse 81 that has been stripped of by stage 1.

The events which take place at the stage 2 switch are similar the events which previously took place at the stage 1 switch. The operation starts at stage 2 by Input Port 1 activating the IN1-HI-PRI and IN1-VALID interface control lines simultaneously to logical ones as they get connected through from stage 1. The IN1-HI-PRI signal controls the high priority logic path in FIG. 5, and its activation to a logical one removes the reset from latches 172 and 174 and enables them.

The next occurrence, as shown in FIG. 6, is command pulse 73 on IN1-DATA 1 interface line that commands Input Port 1 to make a high priority connection to Output Port 1. Pulse 73 being on IN1-DATA 1 causes latch 172 at the second stage switch to set on the rise of pulse 73 and latch 174 to set on the fall of pulse 73. Latch 174 being set causes the dual priority switch to latch the fact that is has received a COMmand to make a HI-PRIority connection from Input Port 1 to Output Port 1 as defined by the COM HI-PRI 11 signal from latch 174. Latch 172 being set causes the PREHI-PRI 11 signal to activate, which in turn causes AND gate 95 to go active creating the WAIT 11 signal. The WAIT 11 signal is sent through NOR gate 115 (where it is inverted) to AND gate 182, where it is driven back to switch stage 1, which in turn passes the signal through the stage 1 switch back to node 1 over the IN1-ACCEPT line causing pulse 75 as shown in FIG. 6. Pulse 75 gives a positive acknowledgement of when the commanded connection gets established. As long as the WAIT 11 signal is active, the dual priority switch is waiting to make the connection and has not been successful yet at making the connection. When the connection is made successfully, the WAIT 11 signal goes inactive and passes through gates 115 and 182 to cause the IN1-ACCEPT signal to rise, thus completing pulse 75 and giving a positive feedback which is passed through stage 1 that the connection has been made. Pulse 75 shows a slower connection time than pulse 71 because it is a wider pulse. This means that in the stage 2, Output Port 1 was not immediately available for connection as shown by the OUT1-NOT BUSY signal 201 in FIG. 6 indicating that Output Port 1 is BUSY with a previous connection and not available to establish a new connection until the pulse 201 occurs. At pulse 201 time the "Enable Hi-PRI 11" signal is issued by block 140 as shown by pulse 209, which assigns the next connection to be made to Output Port 1 as coming from Input Port 1. The "Enable HI-PRI 11" signal being activated goes to AND gate 178 to be OR'ed with the low priority signal (LCONNECT 11) in gate 190 and generate a composite signal CONNECT 11 defining to the dual priority switch to make the connection of Input Port 1 to Output Port 1. The Connect 11 signal is inverted in gate 192 and goes to gate 95 where it causes the WAIT 11 signal to go inactive (as shown by the termination of pulse 205), and cause pulse 75 to end. This completes the establishment of a high priority connection through both stages of a two stage network, connecting two nodes together by a network path that goes from a first node through Input Port 1 to Output Port 1 of switch stage 1 to Input Port 1 of switch switch stage 2 to Output Port 1 of switch stage 2 to a second node. Message data as shown in FIG. 6 can now flow from the first node to the second node.

The result of this implementation is that a high priority path is established at the quickest possible speed because the high priority command is stored at the switch stage involved and made on a priority basis as soon as output port required becomes available. In addition, a positive feedback is given to the node establishing the connection immediately upon the making of the connection so that it may proceed at the earliest possible moment.

Figure 7B:
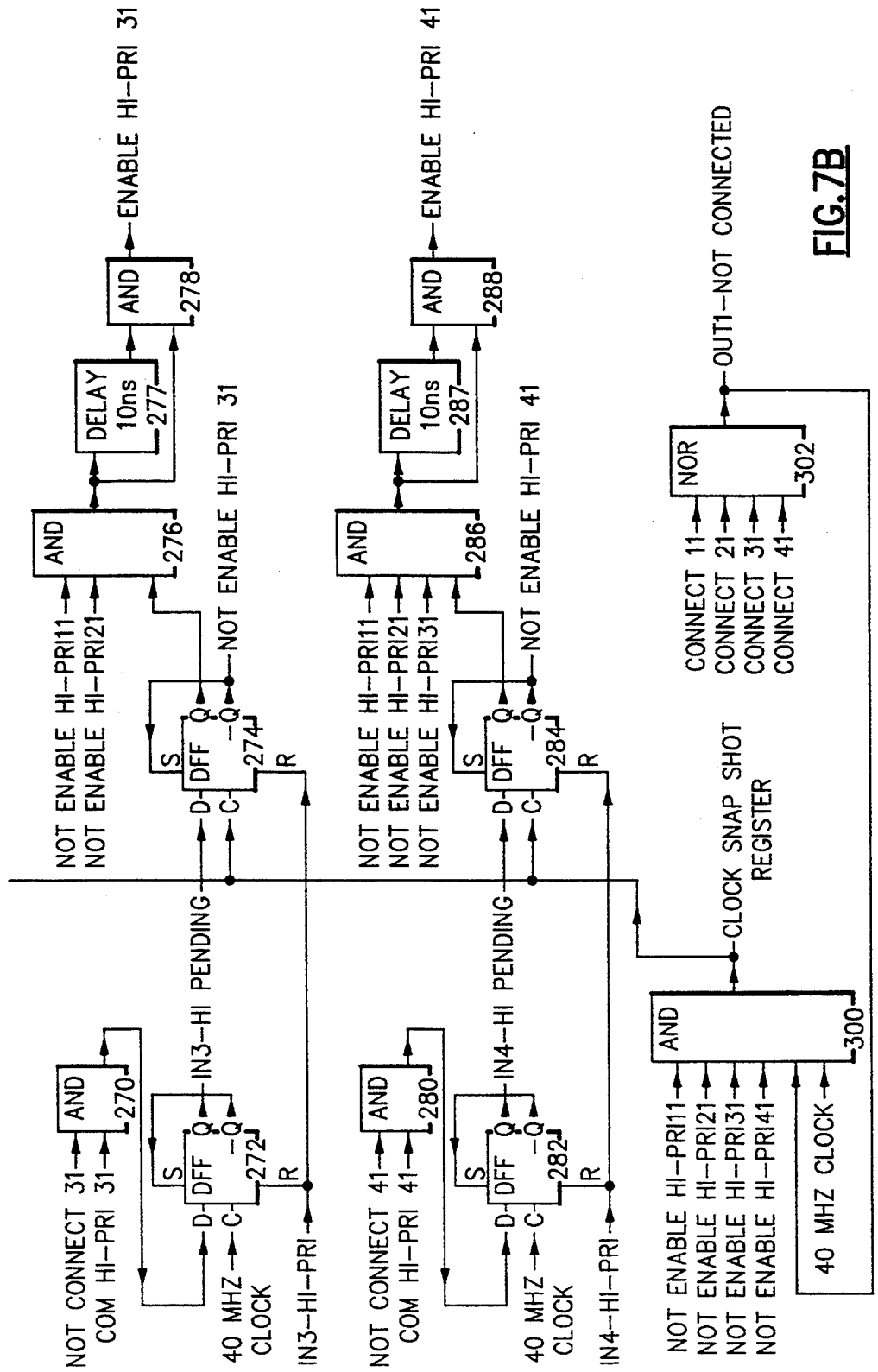

Key to the high priority implementation is the function provided by block 140, which is shown in detail in FIG. 7. Typical logic is shown for establishing a high priority connection from Input Port 1 to Output Port 1 by latches 252 and 254 as they function in relation to gates 250 and 258, and delay block 257. Identical logic is shown for establishing a high priority connection from Input Port 2 to Output Port 1 by latches 262 and 264 as they function in relation to gates 260, 266, and 268, and delay block 267. Identical logic is shown for establishing a high priority connection from Input Port 3 to Output Port 1 by latches 272 and 274 as they function in relation to gates 270, 276, and 278, and delay block 277. Identical logic is shown for establishing a high priority connection from Input Port 4 to Output Port 1 by latches 282 and 284 as they function in relation to gates 280, 286, and 288, and delay block 287.

Block 140 requires sequential logic operations and decisions which require a clock signal to implement. This is the first time that a clock has been necessary to implement any of the ALLNODE Switch concepts. The clock used in FIG. 7 has been selected to be 40 MHZ for the purpose of example, but the clock frequency in general is dependent upon the technology of implementation.

Figure 8:
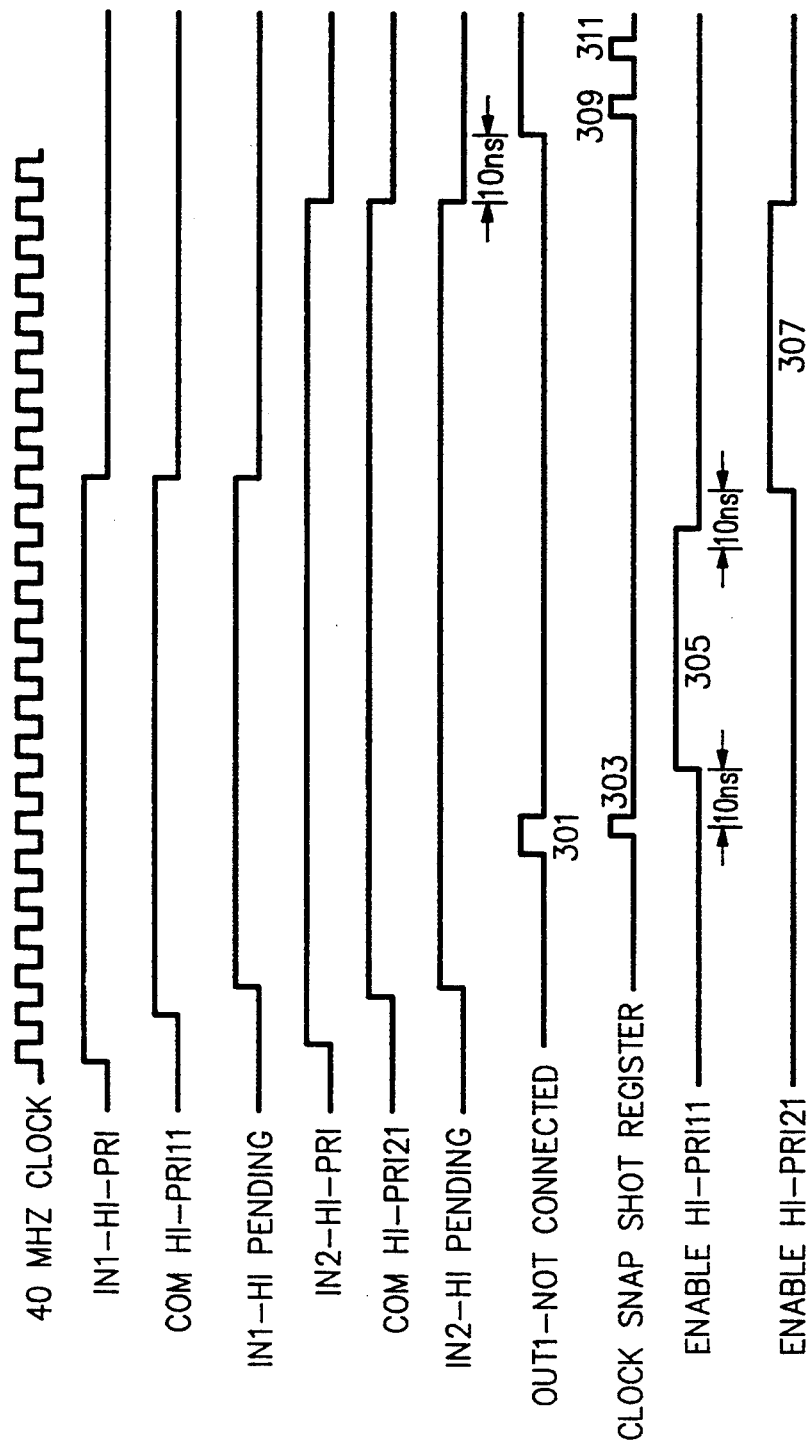
FIG. 8 is a timing diagram, which shows a typical example of the snapshot register timing and how it services multiple requests sequentially at the earliest possible moment based on a built-in priority scheme.

The functions performed by block 140 and shown in FIG. 7 shall be described here by continuing the previous example of Input Port 1 commanding a high priority connection to Output Port 1, and adding to it a simultaneous request of Input Port 2 commanding a high priority connection to Output Port 1, to demonstrate the priority function. The "COM HI-PRI 11" and "COM HI-PRI 21" signals convey this information to the block 140 by going active to AND gate 250 and 260, respectively. Typically, gate 250 inhibits passing the "COM HI-PRI 11" signal, if the NOT CONNECT 11 signal (gate 192 of FIG. 5) is inactive (which means the CONNECT 11—gate 192—is active). This means that if the desired connection has been established already by means of the low priority path, that there is no necessity to make the connection via the high priority path and the high priority operation goes no further. However, for the normal case, the NOT CONNECT 11 signal will be active to gate 250 and the high priority operation will proceed by enabling the gate 250 output to go to latch 252. Latch 252 is enabled by the IN1-HI-PRI signal on its reset line to function whenever Input Port 1 is operating in high priority mode. Latch 252 will set and generate the IN1-HI PENDING signal when gate 250 is active in synchronization with the rise of the 40 MHZ clock signal as shown in the timing of FIG. 8. Latch 252 being set indicates that Input Port 1 has a pending high priority connection that it wishes to make to Output Port 1. The purpose of the block 140 logic is to record this pending command and to make the desired connection on a priority basis at the very earliest moment. The Latch 252-Q output is fed back into the SET input of the same latch to cause it to remain set after initially being set until the IN1-HI-PRI signal goes inactive on the reset input to the latch and causes it to reset.

The latches 254, 264, 274, and 284 comprise the 4-bit SNAP SHOT REGISTER, which allows all pending connections to be made on a rotating basis and prevents any individual user from hogging an Output Port connection and causing the starvation of some other user who is unable to make the required connection. The SNAP SHOT REGISTER is allowed to take "snap shots" only at specified intervals for the purpose of determining what connections are pending. The "snap shot" intervals are defined by AND gate 300 which provides the clock signal that causes the SNAP SHOT REGISTER to sample the pending connection requests coming from registers 252, 262, 272, and 282, respectively. The clocking of the SNAP SHOT REGISTER occurs as determined by gate 300 at a 40 MHZ rate when none of the SNAP SHOT REGISTER bits are set and when the Output Port 1 is not busy as determined by the OUT1-NOT CONNECTED signal from gate 320. Basically the SNAP SHOT REGISTER will be clocked at a 40 MHZ rate as long as Output Port 1 has no present connections to it and there are no active bits in the SNAP SHOT REGISTER.

FIG. 8 shows the timing of the SNAP SHOT REGISTER when both Input Ports 1 and 2 issue pending high priority commands to connect to Output Port 1 and Output Port 1 is previously busy with a previous low priority connection as defined by the OUT1-NOT CONNECTED signal 302 being a zero. FIG. 8 shows that in this case, both the IN1-HI PENDING and IN2-HI PENDING latches 254 and 264 get set and both wait for Output Port 1 to become available. At pulse time 301, Output Port 1 terminates its previous connection and becomes available. Assuming that the SNAP SHOT REGISTER has no bits set previously, the CLOCK SNAP SHOT REGISTER signal goes active producing pulse 303 during coincidence with the next 40 MHZ clock signal after pulse 301. Pulse 303 goes to all 4 bits of the SNAP SHOT REGISTER and causes them to set to the state corresponding to the state of latches 252, 262, 272, and 282, respectively. In the example, both the SNAP SHOT REGISTER latches 254 and 264 will set at this time. This will cause the "Enable HI-PRI 11" signal to go active after a delay of 10 ns through block 257 and gate 258. This selects Input Port 1 to connect to Output Port 1 next by issuing pulse 305. Note, that even thought latch 264 gets set by pulse 303, "Enable HI-PRI 21 signal doesn't go active at the same time as pulse 305 because it is prevented by gate 266, since the "NOT Enable HI-PRI 11" signal is a zero at this time.

After Input Port 1 sends its message to Output Port 1, it breaks its connection to Output Port 1 by deactivating its IN1-HI-PRI signal as shown in FIG. 8 which in turn resets COM HI-PRI 11, IN1-HI PENDING and ENABLE HI-PRI 11 (a bit in the SNAP SHOT REGISTER). At this time only Latch 264 remains set in the SNAP SHOT REGISTER, gate 266 is enabled to pass the indication to delay block 267 which causes the "ENABLE HI-PRI 21" signal 268 to go active 10 ns later to produce pulse 307 in FIG. 8 and select Input Port 2 to connect to Output Port 1 next. After Input Port 2 sends its message to Output Port 1, it breaks its connection to Output Port 1 by deactivating its IN2-HI-PRI signal as shown in FIG. 8, which in turn resets COM HI-PRI 21, IN2-HI PENDING and ENABLE HI-PRI 21 (based on resetting a bit in the SNAP SHOT REGISTER). Then Output Port 1 has serviced all of its pending connections, the CLOCK SNAP SHOT REGISTER signal 300 begins clocking the SNAP REGISTERS again by issuing pulses like 309 and 311 and which continue until Output Port 1 becomes connected again or until another high priority operation gets latched into the SNAP SHOT REGISTER.

The purpose of delay blocks 257, 267, 277 and 287 is to prevent one connection from following too closely behind another and causing erroneous operation prior to the time the interface signals settle out.

FIGS. 5 and 7 show the unique circuit implementations required within the dual priority switch. Further replications of the FIG. 5 functions are required to totally define all input ports as they each connect to all output ports. However, these implementations are an obvious extension of FIG. 5 and are not shown here.

Clearly, the inventions we have described by way of example of our preferred embodiments and in illustration of the best mode for practicing them provide a basis for much potential growth in the performance of switching networks for high speed data processing. Accordingly, it will be understood that those skilled in the art after reviewing our presently contemplated mode of practicing our inventions, both now and in the future, will envision further improvement and make enhancements and inventions without departing from the scope of the following claims which should be construed to protect and maintain the rights of the inventors in light of other developments.

What is claimed is:

1. A switching system for a network, the switching system comprising:
   a first node having a first priority level transmission;
   a second node having a second priority level transmission;
   switch means coupled with said first and second nodes for receiving said first and second priority level transmissions unbuffered, for providing the first and second priority level transmissions to an unbuffered single network path, for assigning a different priority level to each of said transmissions, and for allowing each of said transmissions to be transmitted over said single network path,
   said switch means including assignment means for assigning guaranteed delivery transmissions a high priority level.

2. A switching system for a network, the switching system comprising:
   a first node having a first priority level transmission;
   a second node having a second priority level transmission;
   switch means coupled with said first and second nodes for receiving said first and second priority level transmissions unbuffered, for providing the first and second priority level transmissions to an unbuffered single network path, for assigning a different priority level to each of said transmissions, and for allowing each of said transmissions to be transmitted over said single network path,
   said switch means including a switching element that can be commanded by a HI-PRI interface line to operate in a dual priority high/low mode, said high mode for transmitting data immediately under non-contention conditions.

3. A switching system according to claim 2 wherein said switch means further includes employing means for changing said switch means automatically to a high priority mode under contention and blockage conditions.

4. A switching system according to claim 3 wherein said employing means for changing said switch means automatically to a high priority mode under contention and blockage conditions includes setting means for setting a high priority pending latch to remember connections which must be established as soon as the contention or blockage condition is removed.

5. A switching system according to claim 3 wherein said employing means for changing said switch means automatically to a high priority mode under contention and blockage conditions includes detection means for detection of abatement of the blockage condition and recognition means for recognizing a line arising to make a desired connection.

6. A switching system according to claim 3 wherein said employing means for changing said switch means automatically to a high priority mode under contention and blockage conditions includes KILL means for starting a REJECT sequence which causes all previously established connections to be broken or KILLED and everything in a KILL path to be returned to an idle state.

7. A switching system according to claim 3 wherein said employing means for changing said switch means automatically to a high priority mode under contention and blockage conditions includes cascade means for cascading and maintaining functionality and compatibility of stages across a plurality of cascaded stages in a multi-stage network using said switching system.

8. A switching system according to claim 6 wherein said KILL means includes means for dissolving a valid connection at a port and for sending a REJECT signal to an input port to which it was previously connected, causing the input port to which it was previously connected to issue a REJECT signal to its source and then return to the IDLE state.

9. A switching system for a network, the switching system comprising:
   a first node having a first priority level transmission;
   a second node having a second priority level transmission;
   switch means coupled with said first and second nodes for receiving said first and second priority level transmissions unbuffered, for providing the first and second priority level transmissions to an unbuffered single network path, for assigning a different priority level to each of said transmissions, and for allowing each of said transmissions to be transmitted over said single network path,
   said switching system forming part of an asynchronous, unclocked, and unbuffered switching network.

10. A switching system according to claim 2 wherein said switching system further comprises a snapshot register which uses a synchronous method of resolving contention and affects a change from a normal asynchronous means of resolving contention to a priority driven synchronous means of resolving contention under a presence of blockage and high priority conditions.

11. An apparatus for use in a network, said apparatus comprising:
   a plurality of input ports;
   a plurality of output ports; and
   switch means for receiving data unbuffered, simultaneously, and asynchronously from at least two of the input ports, for establishing input to output port connections between each one of said at least two of the input ports and only one of the output ports, and for sending said data unbuffered, simultaneously, and asynchronously to at least two of said output ports over said input to output port connections, said switch means including
   means for detecting whether any of said at least two of said output ports is blocked during a data sending operation intended for a blocked output port,
   control line means for maintaining input to output port connections to said blocked output port established prior to detecting said blocked output port, and means for resuming the data sending operation through at least the input to output port connections to said blocked output port maintained by said control line means when the blocked output port becomes unblocked.

12. The apparatus according to claim 11, wherein the switch means further includes activation means for activating and deactivating the control line means and the means for resuming the data sending operation when the blocked output port is detected.

13. The apparatus according to claim 12, wherein the activation means includes means for deactivating the control line means and the means for resuming the data sending operation at any time during the data sending operation in response to a signal from a transmitting device connected to at least one of said at least two of the input ports.

14. The apparatus according to claim 11, wherein the switch means further includes means for sending a WAIT signal back to at least one of said at least two of the input ports when the means for detecting detects the blocked output port for indicating to a transmitting device connected to the input port and which initiated the data sending operation that the blocked output port is blocked.

15. The apparatus according to claim 14, wherein the switch means further includes means for cancelling the WAIT signal when said at least one of the output ports becomes unblocked to indicate to the transmitting device to transmit data signals for resuming or terminating the data sending operation.

16. The apparatus according to claim 11 further comprising priority determination means for determining priority of use of the blocked output port among at least two of said input to output port connections to the blocked output port maintained by said control line means when the blocked output port becomes unblocked.

17. The apparatus according to claim 16, wherein the priority determination means is a rotating priority means for ensuring that said at least two of said input to output port connections to the blocked output port maintained by said control line means gain access to the blocked output port in a predetermined order.

18. The apparatus according to claim 11 wherein the network is a single stage network.

19. The apparatus according to claim 11 wherein the network is a multistage stage network formed by cascading additional ones of said apparatus into a plurality of stages, wherein each output port of an apparatus in a preceding stage is coupled to an input port of an apparatus in a succeeding stage, each of said stages comprising more than one said apparatus.

20. A multi-stage bufferless switching network, the network comprising:

a plurality of bufferless switching apparatuses cascaded into a plurality of stages, said switching apparatuses each including a plurality of switch inputs and a plurality of switch outputs, of the switch outputs included on any one of said switching apparatuses each coupled to a different one of the switching apparatuses via a switch input of said different one of the switching apparatuses, switch outputs of last stage switching apparatuses each comprising a network output port and switch inputs of first stage switching apparatuses each comprising a network input port;

the network output ports each coupled to a network input port through one of a plurality of nodes, each of said nodes comprising means for receiving a data message from a coupled network output port and means for sending a data message to a coupled network input port, said data message to a coupled network input port including a path connection request;

said switching apparatuses each including:

connection means for establishing a communication path between any one of the network input ports and any one of the network output ports in response to said connection request received at said any one of the network input ports, said communication path for transmitting a data message received at said any one of the network input ports to said any one of the network output ports, said connection means including asynchronous connection means for establishing asynchronously a plurality of simultaneously active communication paths between a plurality of network input ports and a plurality of network output ports in response to a plurality of connection requests received separately or simultaneously at said plurality of network input ports, said simultaneously active communication paths for transmitting a plurality of data messages received separately or simultaneously at said plurality of network input ports to said plurality of network output ports; and high priority connection means for detecting a preselected high priority signal sent with any data message received at any of the network input ports, for maintaining in an active state a communication path partially established for a data message blocked by a used switch output, and for enabling the connection means to finish establishing the partially established communication path through the used switch output when the used switch output becomes unblocked.

21. The switching network according to claim 20, wherein the high priority connection means includes:

means for sending back to a sending node a 'wait' signal for indicating to the sending node that the high priority connection means is waiting for the used switch output to become unblocked; and means for sending back to the sending node a 'continue' signal when the used switch output becomes unblocked for indicating to the sending node to continue sending the data message blocked by the used switch output.

22. A bufferless switching network comprising:

a bufferless switching apparatus comprising a plurality of switch inputs and a plurality of switch outputs;

a plurality of nodes each coupled to one of the switch outputs and to one of the switch inputs, each node comprising means for receiving a data message from a coupled switch output and means for sending a data message to a coupled switch input, the data message to a coupled switch input including a connection request;

said bufferless switching apparatus including connection means for establishing a communication path between any one of the switch inputs and any one of the switch outputs in response to said connection request received at said any one of the switch inputs, said communication path for transmitting a data message received at said any one of the switch inputs to said any one of the switch outputs;

said connection means including:

asynchronous connection means for establishing asynchronously a plurality of simultaneously active communication paths between a plurality of switch inputs and a plurality of switch outputs in response to a plurality of connection requests received separately or simultaneously at said plurality of switch inputs, said simultaneously active communication paths for sending a plurality of data messages received separately or simultaneously at said plurality of switch inputs to said plurality of switch outputs; and high priority connection means for detecting a preselected high priority signal sent with any data message received at any of the switch inputs, for maintaining in an active state a communication path partially established for a data message blocked by a used switch output, and for enabling the connection means to finish establishing the partially established communication path through the used switch output when the used switch output becomes unblocked.

23. A bufferless switching apparatus comprising:

a plurality of switch inputs and a plurality of switch outputs;

connection means for establishing a communication path between any one of the switch inputs and any one of the switch outputs in response to a connection request received at said any one of the switch inputs, said communication path for transmitting a data message received at said any one of the switch inputs to said any one of the switch outputs;

said connection means including:

asynchronous connection means for establishing asynchronously a plurality of simultaneously active communication paths between a plurality of switch inputs and a plurality of switch outputs in response to a plurality of connection requests received separately or simultaneously at said plurality of switch inputs, said simultaneously active communication paths for transmitting a plurality of data messages received separately or simultaneously at said plurality of switch inputs to said plurality of switch outputs; and high priority connection means for detecting a preselected high priority signal sent with any connection request received at any of the switch inputs, for maintaining in an active state a communication path partially established because of a used switch output, and for enabling the connection means to finish establishing the partially established communication path to the used switch output when the used switch output becomes clear.

* * * * *